(12) United States Patent
Hall et al.

(10) Patent No.: US 9,670,306 B2
(45) Date of Patent: *Jun. 6, 2017

(54) LIQUID COVERLAYS FOR FLEXIBLE PRINTED CIRCUIT BOARDS

(75) Inventors: Stephen Anthony Hall, Wells (GB); Richard Charles Davis, Bath and North (GB); Simon Richard Ford, Bath and North (GB); Matthias Klaus, Strausberg (DE); Karl-Heinz Ognibeni, Kirchheimbolanden (DE)

(73) Assignee: Sun Chemical Corporation, Parsippany, NJ (US)

( * ) Notice: Subject to any disclaimer, the term of this patent is extended or adjusted under 35 U.S.C. 154(b) by 75 days.

This patent is subject to a terminal disclaimer.

(21) Appl. No.: 13/256,619

(22) PCT Filed: Mar. 16, 2010

(86) PCT No.: PCT/GB2010/050449
§ 371 (c)(1),
(2), (4) Date: Sep. 23, 2011

(87) PCT Pub. No.: WO2010/106359
PCT Pub. Date: Sep. 23, 2010

(65) Prior Publication Data
US 2012/0000696 A1    Jan. 5, 2012

Related U.S. Application Data

(60) Provisional application No. 61/160,376, filed on Mar. 16, 2009, provisional application No. 61/255,895, filed on Oct. 29, 2009.

(51) Int. Cl.
| | | |
|---|---|---|
| *C08G 73/14* | (2006.01) | |
| *C09J 177/08* | (2006.01) | |
| *C08G 18/34* | (2006.01) | |
| *C08G 18/80* | (2006.01) | |
| *C09D 179/08* | (2006.01) | |
| *H05K 3/28* | (2006.01) | |
| *C08L 63/00* | (2006.01) | |
| *H01B 3/30* | (2006.01) | |
| *H05K 1/03* | (2006.01) | |

(52) U.S. Cl.
CPC ....... *C08G 18/345* (2013.01); *C08G 18/8074* (2013.01); *C08G 73/14* (2013.01); *C09D 179/08* (2013.01); *H05K 3/285* (2013.01); *C08L 63/00* (2013.01); *H01B 3/306* (2013.01); *H05K 1/0393* (2013.01); *H05K 3/287* (2013.01); *H05K 2201/0154* (2013.01)

(58) Field of Classification Search
None
See application file for complete search history.

(56) References Cited

U.S. PATENT DOCUMENTS

| | | | |
|---|---|---|---|
| 3,454,621 | A | 7/1969 | Engel et al. |
| 4,284,572 | A | 8/1981 | Stanley et al. |
| 4,448,844 | A | 5/1984 | Osada et al. |
| 4,497,944 | A | 2/1985 | Nishizawa et al. |
| 4,530,975 | A | 7/1985 | Mukoyama et al. |
| 4,600,729 | A | 7/1986 | Zecher et al. |
| 4,628,079 | A | 12/1986 | Zecher et al. |
| 2006/0241239 | A1 | 10/2006 | Hwang et al. |
| 2008/0146764 | A1 | 6/2008 | Gertzmann et al. |
| 2009/0277666 | A1 * | 11/2009 | Yamauchi et al. ........ 174/119 C |
| 2010/0231345 | A1 | 9/2010 | Kikuchi et al. |
| 2012/0000696 | A1 | 1/2012 | Hall et al. |

FOREIGN PATENT DOCUMENTS

| | | | |
|---|---|---|---|
| EP | 0403044 | A2 | 1/1990 |
| EP | 2070961 | A1 | 6/2009 |
| EP | 2103641 | A1 | 9/2009 |
| GB | 2084162 | A | 4/1982 |
| JP | 571-11352 | A * | 7/1982 |
| JP | 58-80326 | A | 5/1983 |
| JP | 62-263692 | S | 11/1987 |
| JP | 1990-072693 | | 3/1990 |
| JP | 03-181511 | | 8/1991 |
| JP | 2987950 | | 12/1999 |
| JP | 2007-100079 | A * | 4/2007 |
| JP | 2009-149757 | A * | 7/2009 |
| WO | WO 2008/004491 | A1 * | 1/2008 |
| WO | 2008/072495 | A1 | 6/2008 |

OTHER PUBLICATIONS

SunChemical, "New Materials for Flex—and Rigid/Flex-Circuitry From Sun Chemical," Munich, Germany, Nov. 2009, 45 pages.*
"Phenol Blocked Polyisocyanate Super CY Stable", downloaded from http://www.superurecoat.com/super-cy-stable.htm on Mar. 4, 2014.
"Dispersity"—downloaded from http://en.wikipedia.org/wiki/polydispersity_index on Mar. 12, 2014.
Office Action issued on Nov. 22, 2013 in connection with Chinese application No. 201080049523.5 (with English translation).
Office Action issued on Jan. 6, 2014 in connection with Chinese application No. 201080020479.5 (with English translation).
Liu, De-hui et al., "Synthesis of a Polyamide-imide by Blocking End Groups", Insulating Materials (2002), No. 1, pp. 9-11. (with English translation).
Liu, Wen-qin and Zhang, Qing-qi, "Self-lubricating Polyamide Imide (PAI) Wire Paint", Insulating Materials (2000), No. 4, pp. 8-10. (with English translation).

(Continued)

*Primary Examiner* — Ana Woodward
(74) *Attorney, Agent, or Firm* — Frost Brown Todd LLC

(57) ABSTRACT

The present invention relates to curable liquid coverlay compositions comprising polyamideimide resins for use in curable compositions for use as protective coverlay coatings for metal clad laminate materials in electronic components, such as flexible circuit boards. In particular, the invention relates to liquid coverlay compositions comprising polyamideimides having a terminal isocyanate group blocked by a thermally-dissociatable isocyanate-blocking group and the use of such compositions in preparation of flexible electronic components.

12 Claims, 3 Drawing Sheets

(56) References Cited

OTHER PUBLICATIONS

Office Action issued on Nov. 19, 2013 in connection with Japanese application No. 2012-500315 (with English translation).
English language translation of JP 2009-149757 published Jul. 9, 2009 with Certification of true and accurate English language translation.
Office Action issued on Jul. 1, 2014 in connection with Japanese application No. 2012-500315 (with English translation).
Office Action issued on Jun. 4, 2014 in connection with Chinese application No. 201080049523.5 (with English translation).
Office Action issued on Sep. 3 2014 in connection with Chinese application No. 201080020479.5 (with English translation).
Office Action issued on Jun. 4, 2014 in connection with European application No. 10770845.5.
Lee, Jung Min, et al. "Thermal Decomposition Behavior of Blocked Diisocyanates Derived from Mixture of Blocking Agents" Macromolecular Research, Oct. 2005, vol. 13, No. 5, pp. 427-434.
Korean Office Action issued in Korean Application No. 2011-7024208, dated Nov. 20, 2015 (with English Language Translation).
Chinese Notification of Grant issued in Chinese Application No. 201080020479.5, dated Dec. 4, 2015 (with English Language Translation).
Indian Office Action issued in Indian Application No. 3587/DELNP/2012 dated Nov. 26, 2015.
Cognard, Philippe. "Adhesives and Sealants: Basic Concepts and High Tech Bond," Handbook of Adhesives and Sealants. vol. 1. 2005.0 pp. 107-108. Elsevier Ltd. Amsterdam, Netherlands.
Szycher, Michael, Ph.D. "Szycher's Handbook of Polyurethanes" Isocyanate Chemistry. 1999. pp. 4-15 to 4-17. CRC Press LLC.

\* cited by examiner

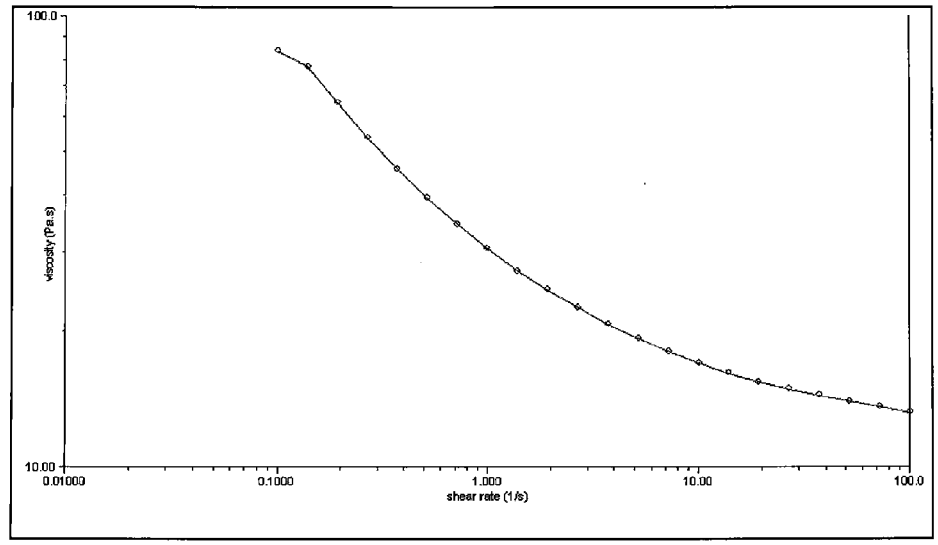

Figure 1

Table 1 — Classification of test results

| Classification | Description | Appearance of surface of cross-cut area from which flaking has occurred (Example for six parallel cuts) |
|---|---|---|
| 0 | The edges of the cuts are completely smooth; none of the squares of the lattice is detached. | — |
| 1 | Detachment of small flakes of the coating at the intersections of the cuts. A cross-cut area not significantly greater than 5 % is affected. | |
| 2 | The coating has flaked along the edges and/or at the intersections of the cuts. A cross-cut area significantly greater than 5 %, but not significantly greater than 15 %, is affected. | |
| 3 | The coating has flaked along the edges of the cuts partly or wholly in large ribbons, and/or it has flaked partly or wholly on different parts of the squares. A cross-cut area significantly greater than 15 %, but not significantly greater than 35 %, is affected. | |
| 4 | The coating has flaked along the edges of the cuts in large ribbons and/or some squares have detached partly or wholly. A cross-cut area significantly greater than 35 %, but not significantly greater than 65 %, is affected. | |
| 5 | Any degree of flaking that cannot even be classified by classification 4. | |

Figure 2

LIQUID COVERLAYS FOR FLEXIBLE PRINTED CIRCUIT BOARDS

This application is a national stage application of PCT/GB2010/050449, filed Mar. 16, 2010, which claims priority from U.S. Provisional Patent Application Nos. 61/160,376 and 61/255,895, filed on Mar. 16, 2009 and Oct. 29, 2009 respectively, all of which are incorporated herein by reference in their entirety.

FIELD OF THE INVENTION

The present invention relates materials for use in curable compositions for use as protective coverlay coatings for metal clad laminate materials, such as flexible circuit boards. In particular, the invention relates to curable liquid coverlay compositions comprising polyamideimide resins and the use of such liquid coverlay compositions in the formation of coated electronic components.

BACKGROUND

Traditional coverlays currently used in the electronic industry are typically only available as polyimide-type dry films or foils and are supplied as sheets or rolls. The use of these materials involves high cost in terms of manpower, material consumption (including wastage) and energy time expenditure. These dry film sheets or rolls can only be applied using a time and cost intensive processes, especially if they are to be used only on selected areas of a panel. To apply coverlays in the form of dry sheets or rolls to the selected areas would require multiple process steps. For example:

1. Cutting those areas from a sheet or a roll by use of laser cutter or cut plotter.
2. Manually removing the protective layer from the adhesive side—the foil is normally supplied with epoxy or acrylic adhesive. Adhesiveless polyimide foils need a separate adhesive which is again supplied in rolls and which needs to be prepared the same way as the polyimide foil.
3. Positioning the polyimide foil (and the adhesive if separate) onto the panel in manual operation with best possible accuracy (>0.8 mm).
4. Fixing the polyimide foil in manual process using a soldering tool.

While it is possible to carry out steps 1-4 by use of automation (e.g. robots) saving significant manual labor and associated expenses, it can be appreciated that the cost of investing in and operating the multiple robots necessary to carry out these operations sequentially is extremely high.

Dry film polyimide coverlays also have technical problems when used in the manufacture of electronic components, such as printed circuit boards, mainly due to the need to use adhesives in combination with the polyimides that can lead to humidity absorption, smearing, dust and limited accuracy of positioning which does not meet the accuracy requirements of modern technology.

Other associated problems with using dry film polyimide coverlay films for mechanical processes such as flexible printed circuits (FPCs) as well as other printed circuit boards (PCBs) and other electronic components include:

Limited accuracy (0.8 mm minimum) due to manual positioning of the films.
Dimensional problems across the z axis.
Foil instability due to manual mounting and press processes.
Compatible only with selective metallization processes. Acrylic adhesive bleeds therefore plasma desmear* required as an additional process step.
Technical problems arise with machining, drilling and routing which include smear and dust.
Each process cycle is very time consuming.

*A general description of "smear" and "desmear" can be found in the following reference: *A Comprehensive Guide to the Design and Manufacture of Printed Circuit Board Assemblies—Volume* 2, William Macleod Ross, Electrochemical Publications, page 232.

Flexible printed circuit (FPCs) constitute an increasingly strong growth area in printed circuit board manufacturing, as they offer numerous advantages over rigid circuit panels. FPC's offer electronic equipment manufacturers the advantage of flexibility and compact high density wiring with high reliability, weight reduction and an overall cost saving. FPC's have been in use since the late 50's/early 60's mainly in military/space applications, however more recently they are more commonly found in retail products such as cameras, mobile phones and MP3 players.

The current manufacturing techniques for producing FPC's are described in *Printed Circuit Board Materials Handbook* by Martin W. Jawitz, McGraw-Hill Professional, 1997, page 784. This highly detailed book explains FPC construction and describes/discusses the assembly steps involved.

One important FPC component is a covering layer (also known as a cover sheet or coverlay); this is a plastic film on the top surface of the FPC to protect it from electrical crossovers and mechanical handling. In traditional flexible printed circuit board fabrication used to produce multi-layer circuitry, each single flex layer has to be covered individually and pressed. The coverlay foil is either used to cover the full area leading to a high material price, or used on selected areas, which incurs high manpower costs. In either case, the dry film or foil-type coverlay is connected to the laminate in a separate press step. The present invention relates to improvements to the covering layer on flexible circuit boards.

The requirements for developing a thermal curing FPC are many. A solder mask for use in a thermal curing FPC advantageously has some or all of the following properties:

Rheology and Thixotrophy resembling a typical screen printed soldermask—high low shear rate structure with the corresponding low high shear rate structure. See FIG. 1.
Processing with existing printing equipment (screen, spray, curtain coat, roller coat, pad print, gravure, flexo, offset, inkjet and spin coating) without any capital expenditure.
Screen open time minimum 4 hours.
Cures at max 150° C. (until lamination stage)
Must withstand lamination temperatures (typically 180° C. for 70 minutes or 220° C. for 40 minutes)
Double coating without adhesion problems, gitterschnit X-hatch of GT0-GT1
Final properties of PI foils need to be matched or exceeded
Dielectric Strength IPC TM650 2.5.6A minimum of 100 KV/mm
Isolation resistance IPC TM650 2.5.9L
Surface resistance IPC TM650 2.5.17L minimum of 1 megohm
Water uptake maximum of 1%
Solder bath resistance IPC TM650 2.4.13 (minimum 260° C. for 2 seconds)

Pass all other final finishes—Nickel-gold and chemical tin with no removal after tape testing.

Resolution of 50/50 μm tracks and gaps with a 25 μm film thickness on all substrates (PI, FR4 etc)

Minimum of 10 μm coverlay on top of 1 oz copper with a 25 μm coating

Flammability rating of UL 94V-0

Resistant to immersion in the following solutions (1 hour): IPA, MEK, Dichloromethane Z-axis CTE—15 ppm below Tg, 80 ppm>Tg
A=as supplied
L=after storage at 96 h, 20° C., 65% r.h.

U.S. Pat. No. 7,364,799 (Toyo Boseki) and WO 2008/072495 (Toyo Boseki) disclose polyamideimide (PAI) resins for application to a flexible medal-clad laminate.

WO 2008/041426 (Hitachi) (also published as EP 2 070 961) discloses a polyamideimide (PAI) resin for a flexible printed circuit board. The PAI has at least one terminal functional group selected from a carbonyl group, an amino group, an acid anhydride group and a mercapto group to enhance the heat resistance.

A problem exists in the use of polyamideimide (PAI) resins as coverlays in that they show poor viscosity stability, this is due to the fact that residual isocyanate groups remaining from the synthesis can react with pendent carboxylic acid groups causing the viscosity to rise with time. If the ratio of isocyanate is reduced to counter this in the synthesis of the PAI then the amount of amide groups are reduced with an increase in the level of imide functionality which results in the solubility of the polymer being much reduced.

SUMMARY OF THE INVENTION

The present invention provides a liquid polyamideimide coverlay composition that can be used to apply a coverlay in a single operation, such as by screen printing (using stencil), dispensing, or by any other means whereby a liquid coverlay can be deposited. The liquid coverlay composition may, for example, be curable ink composition. Typically, a coverlay composition comprises a curable component, a leveling aid, a cure agent and a filler. The coverlay compositions of the present invention advantageously comprise a polyamideimide having a terminal isocyanate group blocked by a thermally-dissociatable isocyanate-blocking group as a curable component. For example, in one embodiment of the present invention, the coverlay composition comprises a caproamide-modified polyamideimide in an aprotic solvent, leveling aid, catalyst, filler(s) with optional use of a difunctional or multifunctional epoxy resin. The coverlay advantageously shows excellent viscosity stability prior to cure, plus outstanding solder resistance, X-hatch adhesion, pencil hardness, solvent resistance and/or flexibility after cure.

In a first aspect, the invention provides a thermal-curing coverlay composition for a flexible printed circuit board substrate, comprising a polyamideimide having a terminal isocyanate group blocked by a thermally-dissociatable isocyanate-blocking group, wherein the composition is a liquid at 25° C. In a second aspect, the invention provides a thermal-curing coverlay composition for a flexible printed circuit board substrate, comprising the reaction product of (i) a polyamideimide having a terminal isocyanate group and (ii) a thermally-dissociatable isocyanate-blocking agent, wherein the composition is a liquid at 25° C. Advantageously, the reaction product of the second aspect of the invention is a polyamideimide having a terminal isocyanate group blocked by a thermally-dissociatable isocyanate-blocking group of the first aspect of the invention. On heating the composition of the first or second aspects of the invention, the isocyanate-blocking group dissociates from the polyamideimide to reveal the terminal isocyanate group. The terminal isocyanate group is advantageously capable of participating in a thermal curing reaction to provide a cured coverlay.

In a third aspect, the invention provides a method of coating a printed circuit board or other electronic component, for example a flexible printed circuit board or other flexible electronic component, comprising the steps of (a) applying a coating of the thermal-curing coverlay composition of the first or second aspect of the invention onto a printed circuit board or other electronic component, and (b) curing the composition.

In a fourth aspect, the invention provides an electronic component, for example a flexible printed circuit board, comprising a cured coating comprising a polyamideimide.

In a fifth aspect, the invention provides a two-pack system for use in preparing a thermal-curing coverlay composition of the first or second aspects of the invention, said two-pack system comprising a first component which includes a polyamideimide having a terminal isocyanate group blocked by a thermally-dissociatable isocyanate-blocking group or which includes the reaction product of (i) a polyamideimide having a terminal isocyanate group and (ii) a thermally-dissociatable isocyanate-blocking agent; and a second component comprising a further thermal-curing compound and/or a curing agent. Advantageously, the polyamideimide having a blocked terminal isocyanate group of the first component of the two-pack system of the fifth aspect of the invention is as defined herein for any of the other aspects of the invention.

In a sixth aspect, the invention provides a method of preparing a thermal-curing coverlay composition for a flexible printed circuit board, which is a liquid at 25° C., comprising the steps of (a) providing either a polyamideimide having a terminal isocyanate group blocked by a thermally-dissociatable isocyanate-blocking group or the reaction product of (i) a polyamideimide having a terminal isocyanate group and (ii) an isocyanate-blocking agent; and (b) combining the compound provided in step (a) with one or more of a filler, a cure agent, a stabiliser, a leveling aid and a further thermally-curable compound. Advantageously, the polyamideimide having a terminal isocyanate group blocked by a thermally-dissociatable isocyanate-blocking group used in the method of the sixth aspect of the invention is as defined herein for any of the other aspects of the invention.

In a seventh aspect, the invention provides a method of preparing a thermal-curing coverlay composition for a flexible printed circuit board, which composition is a liquid at 25° C., comprising the step of reacting (i) a polyamideimide having a terminal isocyanate group and (ii) an isocyanate-blocking agent and the step of combining the product thus obtained with one or more of a filler, a cure agent, a stabiliser, a leveling aid and a further thermally-curable compound to form the coverlay composition.

In an eighth aspect, the invention provides a thermal-curing coverlay composition for a flexible printed circuit board substrate, comprising a polyamideimide, wherein the composition is a liquid at 25° C. and wherein the composition has a viscosity of less than 35 Pa·s at 25° C. after storage for three months at 15° C. The eighth aspect of the invention additionally or alternatively provides a thermal-curing coverlay composition for a flexible printed circuit board substrate, comprising a polyamideimide, wherein the composition is a liquid at 25° C. and wherein there is no more than a 3.5-fold increase in the viscosity at 25° C. after storage for three months at 15° C. The liquid coverlay compositions of the eighth aspect of the invention may, for example, be a composition according to the first or second aspects of the invention.

In a ninth aspect the invention provides the use of a liquid polyamideimide to form complete or partially imaged coverlays in the production of flexible electronic components, such as flexible or rigid-flexible printed circuit boards, displays, photovoltaic devices or membrane switches. In one aspect, the liquid polyamideimide is a polyamideimide having a terminal isocyanate group blocked by a thermally-dissociatable isocyanate-blocking group as used in any of the compositions of the first and second aspects of the invention.

The use of polyamideimide resins in the compositions of the invention, in which the terminal isocyanate group(s) are blocked by a thermally-dissociatable isocyanate-blocking group, such as amide-modified polyamideimide resins wherein the thermally-dissociatable isocyanate-blocking group is an amide, have been found give improved shelf life. In particular, the observed viscosity increases that are typical with polyamideimide-based formulations, are not witnessed when using the polyamideimide resins of the invention. The viscosity increase with polyamideimide resin formulations is due to some latent post reaction between residual isocyanate groups and acid groups on the resin. By blocking the isocyanate groups by reaction with an isocyanate-blocking group, the viscosity increase over time is reduced. Once the thermally-curable composition is dried on the substrate, the isocyanate-blocking group dissociates liberating the isocyanate group which can then cure with acid groups present in the resin.

As such the liquid compositions of the invention are useful in the formation of coverlays. It has been found that liquid coverlay compositions of the invention can replace the more traditional prepeg dry film (for example Pyralux from Dupont) polyimide sheets currently used while retaining the standard properties of the dry film. The present invention advantageously gives a coverlay with excellent solder resistance, X-hatch adhesion, pencil hardness, solvent resistance and flexibility combined with good shelf-life. The liquid polyamideimide coverlays may, for example, be used in a variety of electronic applications for example printed circuit boards (PCBs), photovoltaics, displays and membrane switches. As traditional polyimides used in these areas are applied as dry film coverlays, there is a limit to how these devices can be fabricated. Using liquid polyamideimide coverlays allows the material to be applied directly to the device by a wide range of commonly used application methods for depositing inks and coatings.

The methods of applying liquid coverlays of the present invention have been found overcome or alleviate the aforementioned technical issues associated with established-methods of applying solid dry film or foil coverlays. The use of liquid coverlays offers a much wider range of direct application possibilities than dry films and foils. The liquid coverlays of the present invention allow the application of the liquid coverlay where needed in only one work cycle thus allowing for drastically reduced processing cost. Also the need for only one press cycle for the total lay-up reduces processing cost drastically by saving energy, manpower and time.

The thermal curing coverlay advantageously also has excellent storage stability so that minimal rise in viscosity is seen. To this end, the present invention details the improvement in storage stability that can be obtained with amide-modified polyamide imides.

BRIEF DESCRIPTION OF THE DRAWINGS

FIG. 1 shows a rheogram of a screen printed solder mask produced with TA Instruments AR2000ex control stress rheometer, 4 cm 2° cone, shear rate from 0.1 $s^{-1}$ to 100 $s^{-1}$ @ 25° C. over 22 steps.

FIG. 2 shows in Table 1 the classification of the X-hatch Resistance test results.

DETAILED DESCRIPTION OF THE INVENTION

Figure 3:
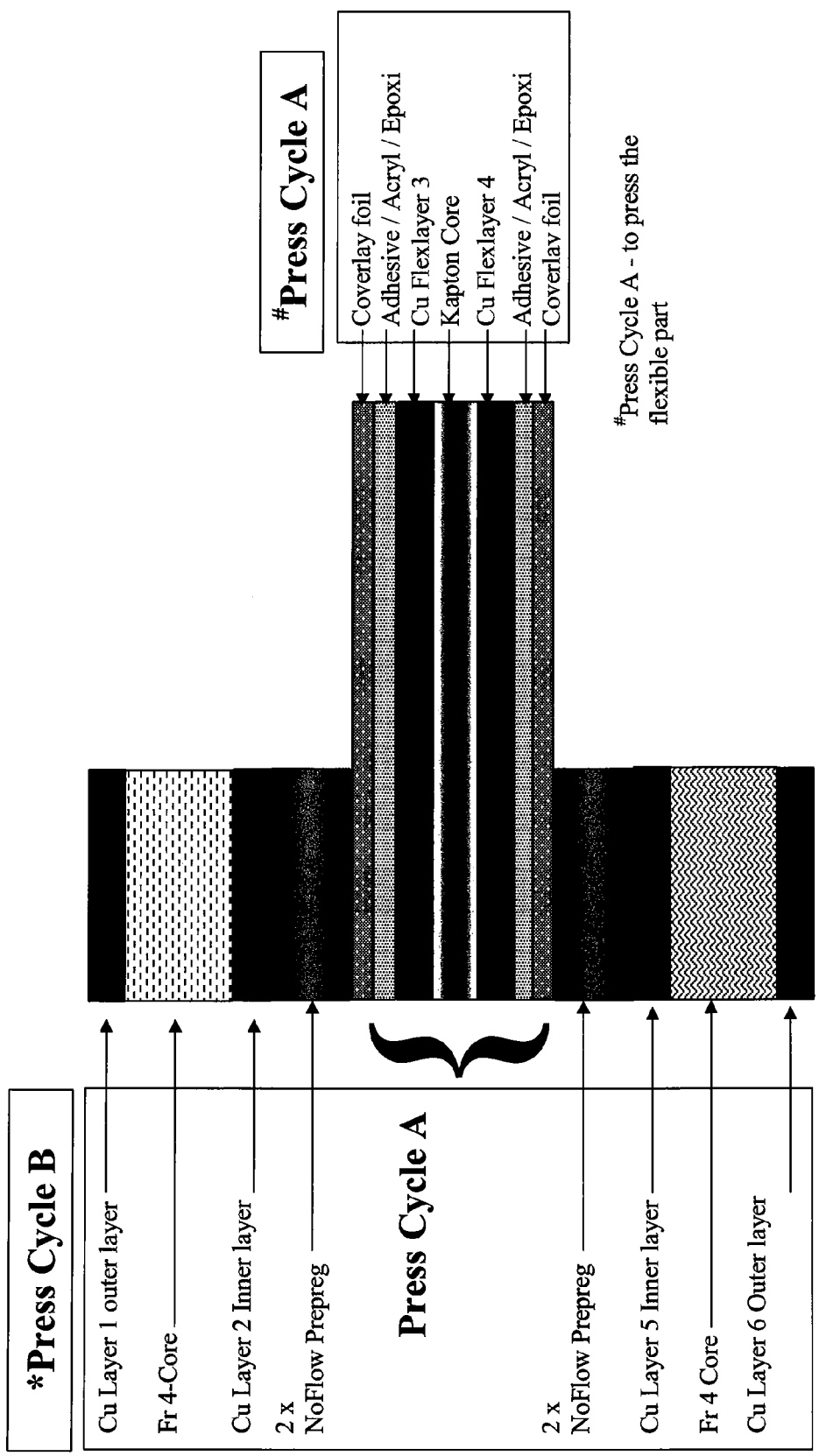
FIG. 3 shows a 6 layer rigid/flex panel with coverlay foil and adhesive.

The present invention relates to a coverlay composition for use on a flexible or rigid-flexible printed circuit board. The term "coverlay" as used herein refers to a protective coating on a printed circuit board on the top surface of the FPC or other electronic component to protect it from electrical crossovers and mechanical handling that may, for example, function as a solder mask. The term "for use on a flexible printed circuit board" is, as is conventional, to be construed as "suitable for use on a flexible printed circuit board", and the skilled person would appreciate that the coverlay would be suitable for use in other electronic components including, in particular, other flexible electronic components such as rigid-flexible printed circuit boards, displays, photovoltaic devices or membrane switches. In one embodiment, the composition is particularly suited for use as a coverlay on a flexible printed circuit board.

A flexible printed circuit board (FPC) is a metal clad laminate comprising a metal foil and a resin layer with good flexibility. A rigid-flexible printed circuit board includes a combination of flexible and rigid substrates laminated into a single article. Typically, rigid-flexible printed circuit boards include interconnecting flexible portions between rigid areas that allows the circuit board to be bent or folded into a three dimensional shape, for example, to replace multiple PCBs interconnected with connectors, wires and ribbon cables with a single article offering improved performance in confined spaces.

The term "polyamideimide" as used herein refers to polymers comprising repeating amidoimide units. Polyamideimides are typically formed by reacting a diamine or diisocyanate with a carboxylic acid functional group-containing carboxylic acid anhydride. Alternatively ways of forming a polyamideimide include reacting a diimide dicarboxylic acid with a diisocyanate or diamine as described in EP 2 070 961 A1. The terms "polyamideimide" and "liquid polyamideimide" will be used as general terms to include all liquid polyamideimides including unmodified, modified (such as caproamide-modified polyamideimides) and photosensitive polyamideimides.

In certain embodiments, the composition comprises a modified polyamideimide resin in which terminal isocyanate groups are blocked using an isocyanate blocking group. Such isocyanate blocking groups are known in the art and are described in, for example, *Adhesives and sealants: basic concepts and high tech bonding, Handbook of Adhesives and Sealants, Volume* 1, Philippe Cognard, Elesvier, 2005, 1$^{st}$ Edition, ISBN 0-08-044554-3 (particularly section 3.3.2.1 on pages 107-108). A "blocked isocyanate" being recognised in the art as an isocyanate that has been reacted with a blocking agent to prevent its reaction at room temperature with a function group in another molecule, such as an acid functional group, but which will dissociate or unblock at elevated temperatures to reveal the isocyanate group and allow further reaction, for example, with an acid functional group. On thermal dissociation of the isocyanate-blocking group, the isocyanate-blocking agent is typically regenerated. Advantageously, the isocyanate-blocking agent is volatile and evaporates from the composition. Various thermally-dissociatable isocyanate blocking agents are commercially available. For example, diethyl malonate, 3,5-dimethylpyrazole, methylethylketoxime and ∈-caprolactam are commercially available from Baxenden Chemicals Limited of Accrington, Lancashire, UK. An alternative term used in the art to describe a blocked isocyanate is a "capped isocyanate". The term "thermally-dissociatable isocyanate-blocking agent" refers to a compound that reacts with an isocyanate group form an isocyanate group blocked by a thermally-dissociatable isocyanate-blocking group. Thus, the "thermally-dissociatable isocyanate-blocking agent" is an isocyanate-blocking agent that is capable of thermally dissociating from a polyamideimide having a terminal isocyanate group. Isocyanate blocking agents typically include a group having a labile proton. Said group having a labile proton is advantageously a nucleophilic group capable of undergoing a nucleophilic addition reaction with an isocyanate group. Said isocyanate-blocking agents typically particulate in a reaction in which the nitrogen atom of the isocyanate group is protonated and the blocking agent adds to the isocyanate to form a new bond between the nucleophilic site of the blocking agent and the carbon atom of the isocyanate. Typical isocyanate blocking agents include: alcohols, such as phenols and polyols; amines; amides, such as lactams; active methylene compounds with a labile methylene proton, such as malonates; nitrogen-containing heteroaryl compounds, such as pyrazoles; oximes; ketoximes, such as dialkyl ketoximes; and hydroxamic acid esters. The term "caproamide-modified polyamideimide" refers to the reaction product of a caproamide isocyanate blocking agent and a polyamideimide having a terminal isocyanate group, that is a polyamideimide with a thermally-dissociatable caproamide isocyanate-blocking group.

The term "carboxylic acid functional group-containing carboxylic acid anhydride" as used herein refers to a compound having both a carboxylic acid functional group (or functional equivalent thereof, such as an acid chloride group) and an acid anhydride functional group. Examples of suitable carboxylic acid functional group-containing carboxylic acid anhydride include trimellic anhydride and cyclohexane tricarboxylic acid anhydride.

The term "aryl" as used herein refers to a $C_{6-12}$ monocyclic, bicyclic or tricyclic hydrocarbon ring, including fused ring systems, wherein at least one ring is aromatic.

The ratio of diisocyanate and a carboxylic acid functional group-containing carboxylic acid anhydride used to prepare a polyamideimide is typically selected such that the majority of the reaction products include an unreacted isocyanate group and an unreacted carboxylic acid group, and, in particular, terminate with an unreacted isocyanate group and an unreacted carboxylic acid group. It is, of course, possible to prepare polyamideimides that predominantly include two unreacted isocyanate groups, for example a polyamideimide that terminates at both ends with an unreacted isocyanate group, by adjusting the proportions of isocyanate and carboxylic acid functional group-containing carboxylic acid anhydride. An isocyanate-terminated polyamideimide in which the terminal-isocyanate group is blocked with an isocyanate blocking group is sometimes referred to in the art as a "capped-polyamideimide" or a "capped-polyamideimide resin".

In one embodiment of all aspects of the invention the polyamideimide is a thermoplastic amorphous polymer whose molecular structure is at least partly aromatic. Polyamideimides hold, as the name suggests, a positive synergy of properties from both polyamides and polyimides, such as high strength, melt processability, exceptional high heat capability, and broad chemical resistance.

In one embodiment of the composition of the first or second aspects of the invention, the polyamideimide having a terminal isocyanate group blocked by a thermally dissociateable isocyanate blocking group has the formula (I):

wherein: ([A]-[B])$_n$ is a polyamideimide unit in which n is at least 4, for example at least 10; and [BL] is a blocking group that is capable of thermally dissociating. In one embodiment, [BL] is —N(R$^1$)—C(O)R$^2$, wherein either R$^1$ is selected from H and $C_1$-$C_6$ alkyl, and R$^2$ is $C_1$-$C_6$ alkyl; or R$^1$, R$^1$ and the amide group to which they are attached together from a 5 to 8-membered lactam ring, optionally substituted with one or more $C_1$-$C_4$ alkyl groups. In yet another embodiment, [BL] is —N(R$^1$)—C(O)R$^2$, wherein either R$^1$ and R$^2$ are each independently selected from $C_1$-$C_6$ alkyl; or R$^1$, R$^1$ and the amide group to which they are attached together from a 5 to 8-membered lactam ring, optionally substituted with one or more $C_1$-$C_4$ alkyl groups. In a further embodiment, R$^1$, R$^1$ and the nitrogen atom and carbonyl group to which they are attached together forms a 5 to 8-membered lactam ring, optionally substituted with one or more methyl groups.

In one embodiment, [BL] is a group derived from a thermally-dissociable isocyanate-blocking agent. In a further embodiment, [BL] is a group derived from a compound of the formula [BL]-H. In a further embodiment, the isocyanate-blocking agent of the second aspect of the invention and/or the compound of the formula [BL]-H, is an isocyanate-blocking agent comprising a labile proton. In a further embodiment the thermally-dissociable isocyanate-blocking agent is an aliphatic amide. The aliphatic amide may, for example be straight chain, branched, or cyclic aliphatic amide. In one embodiment, the amide is optionally substituted with one or more groups selected from $C_{1-6}$ alkyl, $C_{1-6}$ alkoxy, halo and hydroxyl. In another embodiment, the amide is unsubstituted. In one aspect of the invention, the amide is a lactam. Suitable, lactams include γ-butyrolactam, δ-valerolactam and caprolactams, including ∈-caprolactam and δ-caprolactam. Preferably the amide is a caproamide (a $C_6$ amide comprising 6 carbon atoms in a chain or ring), such as a caprolactam. In one embodiment, the amine is ∈-caprolactam. In one embodiment the aliphatic amide is a 5 to 8-membered lactam, optionally substituted with one or more $C_1$-$C_4$ alkyl groups, for example, unsubstituted ∈-caprolactam.

Typically, the polyamideimide comprises alternating units [A] derived from a diisocyanate and [B] derived from a carboxylic acid functional group-containing carboxylic acid anhydride. The composition will typically include a mixture of polyamideimide moieties of differing chain lengths. Advantageously, at least 50 molar % of the polyamideimide molecules have at least four repeating amidoimide units (i.e. n is at least 4). In one embodiment, at least 50 molar % of the polyamideimide molecules are terminated at one end with an isocyanate, i.e. at least 50 molar % of the polyamideimide molecules have a structure that can be approximate as: O=C=([A]-[B])$_n$—OH. In an alternative embodiment, the composition may comprise a relatively high proposition of polyamideimide molecules that are terminated at both ends by an isocyanate group, for example at least 50 molar % of the polyamideimide molecules that comprise an isocyanate group, in combination with another molecular, either another polyamideimide or a different species, that includes at least one, preferably at least two, functional groups that are capable of reacting with an isocyanate group, such as a carboxylic acid functional group. In one embodiment, the composition comprises a mixture of a polyamideimide having a terminal isocyanate group blocked by a thermally-dissociatable isocyanate-blocking group at either end of the polyamideimide a further reactive component comprising two or more functional groups that are capable of reacting with an isocyanate group in a thermal curing reaction, such as a dicarboxylic acid, for example a polyamideimide having a terminal carboxylic acid group at ether end.

In one embodiment of the first and second aspects of the invention, the isocyanate-blocking group is thermally dissociatable at a temperature of at least 50° C., for example a temperature of at least 80° C., such as at least 100° C. In a further embodiment, the isocyanate-blocking group is thermally dissociatable at a temperature of at least 120° C., for example a temperature of at least 140° C., such as at least 150° C. In one embodiment the isocyanate-blocking group is thermally dissociatable at a temperature below 250° C., for example a temperature below 200° C. In one embodiment, the isocyanate-blocking group is thermally dissociatable at a temperature in the range of from 50° C. to 250° C., for example a temperature in the range of from 100° C. to 250° C., such as a temperature in the range of from 140° C. to 200° C. In one embodiment of the third aspect of the invention, the composition is heated to a temperature at which the isocyanate-blocking group thermally dissociates in or prior to the curing step, for example, to a temperature in the ranges specified above with respect to embodiments of the first and second aspects of the invention. In one embodiment, the composition is heated to a temperature of at least 120° C., for example at least 140° C., in or prior to the curing step of the third aspect of the invention. Isocyanate-blocking groups that are capable of dissociating at temperature of greater than 50° C. and especially at least 120° C. or higher, such as at least 140° C. have been found to advantageously provide a capped polyamideimide that is particularly resistant to increases in viscosity on storage. In one embodiment, the isocyanate-blocking groups are capable of dissociating at temperature below 250° C., for example below 220° C., especially below 200° C. The temperature range at which isocyanate-blocking groups formed using isocyanate-blocking agents thermally dissociate is known in the art as the "unblocking range". In one embodiment, the unblocking range of the blocking agent is within the ranges quoted above when used with an aromatic isocyanate. Slight variations in the unblocking range of an isocyanate-blocking group will be expected depending on the isocyanate moiety used. It is within the capability of the skilled person to select blocking agents that unblock within the temperature ranges quoted above and/or verify that the blocking agent selected unblocks within that range for a particular polyamideimide, for example by heating the blocked-polyamideimide until the blocking group dissociates. The unblocking range of commercially available isocyanate-blocking agents are commonly quoted in product specification details. For example, the product specification for isocyanate-blocking agents supplied by Baxenden Chemicals Limited quotes an unblocking range of 100-120° C. for diethyl malonate, 110-120° C. for 3,5-dimethylpyrazole, 140-160° C. for methylethylketoxime and 160-180° C. for ∈-caprolactam when used with an aliphatic isocyanate.

In one embodiment of the first or second aspects of the invention, the polyamideimide having a terminal isocyanate group is the reaction product of a diisocyanate and a carboxylic acid functional group-containing carboxylic acid anhydride. The polyamideimide is advantageously terminated at one end with an isocyanate group and at the other end with a carboxylic acid group. The polyamideimide has at least four repeating amidoimide units, for example at least 10 repeating amidoimide units. In one embodiment the polyamideimide has no more than 100 repeating amidoimide units, for example no more than 60 repeating amidoimide units.

In one embodiment, the polyamideimide having a terminal isocyanate group is the reaction product of a diisocyanate and a carboxylic acid, wherein the diisocyanate has an isocyanate value of at least 420 mgKOH/g, for example greater than 445 mgKOH/g. It has been found when an isocyanate having an isocyanate value of at least 420 mgKOH/g, and especially greater than 445 mgKOH/g, is used a finished polymer is produced that exhibits an acceptable level of cracking on use. In one embodiment the diisocyanate is an aromatic diisocyanate or a partially aromatic diisocyanate. In a further embodiment, the diisocyanate is a compound of the formula (II):

OCN—[X]—NCO    (II)

wherein [X] is an aromatic linker group. The aromatic linker group is optionally substituted with one or more groups selected from $C_{1-6}$ alkyl, halogenated-$C_{1-6}$ alkyl, $C_{1-6}$ alkoxy, halogenated-$C_{1-6}$ alkoxy, halo and hydroxyl. In another embodiment, the aromatic linker group is unsubstituted. In one aspect of the invention [X] comprises at least one aryl ring, for example, two aryl rings. In one embodiment, [X] is a divalent aryl radical. In one embodiment [X] comprises at least one phenyl ring. In one embodiment [X] is diphenylmethane. In one embodiment, —[X]— is —$Ar^1$—Z—$Ar^1$—, wherein $Ar^1$ and $Ar^2$ are each independently selected from aryl optionally substituted with one or more groups selected from halo, $C_1$-$C_4$alkyl, halo$C_1$-$C_4$alkyl, $C_1$-$C_4$alkoxy, halo$C_1$-$C_4$alkoxy, OH, oxo or carboxy$C_1$-$C_4$alkyl; and Z is selected from a carbon-carbon bond, $C_1$-$C_6$ branched or straight chain alkyl or —C(O)—. Suitable diisocyanates include diphenyl methane diisocyanate and 3,3'-dimethyl-4,4'-biphenyl diisocyanate. A mixture of more than one different diisocyanates may be used to prepare the imide for use in the compositions of the invention.

In one embodiment, the carboxylic acid functional group-containing carboxylic acid anhydride is aromatic, for example, trimellitic acid anhydride (1,2,4-benzenetricarboxylic acid cyclic 1,2-anhydride). In an alternative embodiment the carboxylic acid functional group-containing carboxylic acid anhydride is an aliphatic carboxylic acid anhydride, for example, cyclohexane tricarboxylic acid anhydride. In one embodiment, the carboxylic acid functional group-containing carboxylic acid anhydride comprises an aryl ring optionally substituted with one or more groups selected from $C_{1-6}$ alkyl, halogenated-$C_{1-6}$ alkyl, $C_{1-6}$ alkoxy, halogenated-$C_{1-6}$ alkoxy, halo and hydroxyl. In one embodiment, the aryl ring is a phenyl ring. In one embodiment, the carboxylic acid functional group-containing carboxylic acid anhydride is a compound of the formula (III):

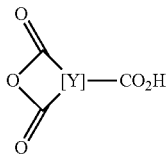
(III)

wherein [Y] is an aromatic or aliphatic group. In a further embodiment, [Y] is an aromatic group. In a yet further embodiment, [Y] comprises an aryl ring optionally substituted with one or more groups selected from $C_{1-6}$ alkyl, halogenated-$C_{1-6}$ alkyl, $C_{1-6}$ alkoxy, halogenated-$C_{1-6}$ alkoxy, halo and hydroxyl. In one embodiment, [Y] is a phenyl. In one embodiment, the carboxylic acid may be activated prior to the reaction with the isocyanate. For example, the carboxy groups may be converted to acid chloride groups. A mixture of more than one different carboxylic acid functional group-containing carboxylic acid anhydrides may be used to prepare the imide of the invention.

In one embodiment of the first or second aspects of the invention, the polyamideimide having a terminal isocyanate group blocked by a thermally dissociateable isocyanate blocking group is a compound of the formula (Ia):

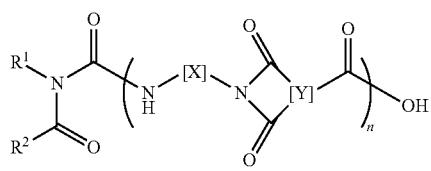
(Ia)

wherein n is at least 2; either $R^1$ and $R^2$ are each independently selected from $C_1$-$C_6$alkyl; or $R^1$, $R^1$ and the amide group to which they are attached together from a 5 to 8-membered lactam ring, optionally substituted with one or more $C_1$-$C_4$alkyl groups; [X] is an aromatic linker group as defined above for compounds of the formula (II) above; and [Y] an aromatic or aliphatic group as defined for compounds of the formula (III) above.

In a further embodiment, $R^1$ and $R^2$ together with the nitrogen atom and carbonyl group to which they are attached together from a lactam ring of the formula (IV):

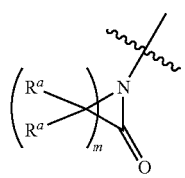
(IV)

wherein m is from 3 to 6; and each $R^a$ is independently selected from H and $C_1$-$C_4$alkyl. In one embodiment, all but one $R^a$ is H and the remaining $R^a$ is a $C_1$-$C_4$alkyl, for example methyl, ethyl or n-propyl, especially methyl. In another embodiment, each $R^a$ is H. In one embodiment m is 3 to 5, for example 3 or 4, especially 3.

In one embodiment of the first or second aspects of the invention, the coverlay composition is suitable for application by screen printing, roller coating, dip coating, curtain coating, spray coating, spin coating, ink jet, gravure coating, offset coating, flexo coating, dispensing, pad printing, brushing, flood coating or aerosol deposition. In a further embodiment the composition is suitable for application in a printing technique such as screen printing, offset printing or flexo printing, especially screen printing.

In one embodiment of the first or second aspects of the invention, the coverlay comprises an organic or inorganic filler. Suitable inorganic fillers include talc, barium sulfate, barium titanate, silica, alumina, clay, magnesium carbonate, calcium carbonate, aluminum hydroxide and silicate compounds. Suitable organic fillers include silicone resins, silicone rubber and fluorine resins. Inclusion of a filler and, in particular, an inorganic filler, is advantageous not only for the flow properties of the thermal-curing coverlay composition, but also for enhanced cohesion and hardness. In one embodiment of the first or second aspects of the invention, the coverlay comprises a leveling aid. Leveling aids are substances used to eliminate unevenness of the film surface formed during printing and application. Suitable leveling agents include acrylic-based and silicone-based surfactants such as those supplied by Samuel Banner & Co Ltd under the trade name "FoamBlast". The leveling aid may additionally function as a defoaming agent to eliminate foam produced during printing, application and curing. In one embodiment of the first or second aspects of the invention, the coverlay comprises a cure agent. Cure agents promote curing of the thermal curing components in the coverlay composition such as the unblocked isocyanate-terminated polyamideimide and any optional epoxy compounds present. Typically, cure agents function as Lewis-base catalysts promoting curing reactions. Suitable cure agents include diamides, such as dicyandiamide, and imidazole derivatives (also known as blocked-imidazoles), such as azine imidazoles. Advantageously, the cure agent is activated on exposure to heat to produce a reactive species that promotes curing. The cure agent may, for example, be activated within the temperature ranges at which the thermally-dissociatable isocyanate-blocking group dissociates or at a higher temperature in a subsequent curing step. In one embodiment of the first or second aspects of the invention, the coverlay comprises a stabiliser. Suitable stabilisers include antioxidants and polymerisation inhibitors.

In one embodiment of the third aspect, the invention provides a method of coating a flexible or rigid-flexible printed circuit board, display, photovoltaic device or membrane switch comprising the steps of (a) applying a coating of the thermal-curing coverlay composition of the first or second aspect of the invention onto the flexible or rigid-flexible printed circuit board, display, photovoltaic device or membrane switch, and (b) curing the composition. Step (b) typically includes the step of heating the composition to a temperature of at least 100° C., for example at least 140° C., for example to dissociate the blocking agent. Step (b) may include a second heating step in which the composition is heated to a higher temperature than in the first heating step for example to cure the composition. The second heating step may, for example, involve heating the composition to a temperature of at least 160° C., for example at least 200° C. In a further embodiment, the invention provides a method of coating a flexible printed circuit board comprising the steps of (a) applying a coating of the thermal-curing coverlay composition of the first or second aspect of the invention onto the flexible printed circuit board, and (b) curing the composition.

In one embodiment of the fourth aspect, the invention provides an electronic component comprising a cured coverlay coating comprising a polyamideimide wherein the coverlay is in direct contact with a metal-clad laminate substrate, such as a printed circuit board. It has been found that the liquid polyamideimide resin compositions of the present invention may be applied directly onto the printed circuit board or other electronic component substrate such that, once cured, the coverlay layer bonds to and directly overlays the substrate, that is without an intervening layer. The cured coverlay coating is advantageously-bonded to the substrate, for example to a flexible printed circuit board, without the need for an adhesive or the like to attach the coverlay to the substrate. In one embodiment the electronic component is a flexible or rigid-flexible printed circuit board, display, photovoltaic device or membrane switch. In a further embodiment, the invention provides flexible printed circuit board comprising a cured coating comprising a polyamideimide. Advantageously, the cured coating comprising a polyamideimide is the product of exposing a liquid coverlay composition comprising a polyamideimide to heat to thermally cure the composition. The liquid coverlay composition may, for example, be a composition according to the first, second or eighth aspect of the invention.

In one embodiment of the first and second aspect so the invention of the invention, the composition is provided as 1-pack system with all components of the coverlay composition provided in a single container. A single pack system has the advantage that it can be used as supplied.

In one embodiment of the fifth aspect of the invention, the first component is provided in a first container and the second component is provided in a second container. It has been found that enhanced thermal and mechanical properties can be obtained using a 2-pack system. In one embodiment of the fifth aspect of the invention, the second component comprises a cure agent that promotes curing on heating and a further thermal-curing compound.

The coverlay composition of the first, second or eighth aspects of the invention, optionally comprises a epoxy resin. In one embodiment of the fifth or sixth aspects of the invention, the further thermal-curing compound is an epoxy resin. Advantageously, the epoxy resin is a multifunctional epoxy compound having two or more epoxy groups. Examples of multifunctional epoxy compounds include polyglycidyl ethers, such as polyglycidyl ethers obtained by reacting epichlorohydrin with polyhydric phenols (such as bisphenol A, novolac type phenol resins, ortho-cresol novolac type phenol resins) or polyhydric alcohols (such as 1,4-butanediol); or polyglycidyl esters obtained by reacting polybasic acids (such as phthalic acid, hexahydrophthalic acid) with epichlorohydrin, N-glycidyl derivatives of compounds having amine, amide or basic heterocyclic nitrogen atoms, or multifunctional alicyclic epoxy resins. Preferred epoxy resins include bisphenol epoxy resins and novolac epoxy resins. In one embodiment, the composition comprises a combination of more than one epoxy resin. The epoxy resin content typically ranges from 0 to 40 wt % of the total composition, for example from 1 to 30 wt %, especially from 2 to 20 wt % of the total composition. In one embodiment, the epoxy resin content of the composition is at least 3 wt %, for example at least 5 wt % of the total composition.

The composition of the first, second or eighth aspects of the invention, or the two-pack system of the fifth aspect of the invention, optionally comprises one or more of a leveling aid, a stabiliser and a filler, for example a levelling aid and/or a filler. In a yet further embodiment, the composition or two-pack system, for example the first component of the two-pack system, optionally comprises an aprotic solvent.

In one embodiment, the liquid coverlay composition has a viscosity, for example an initial viscosity, of less than 35 Pa·s at 25° C., for example, less than 30 Pa·s at 25° C., especially less than less than 25 Pa·s at 25° C. The liquid coverlay composition may, for example, have an initial viscosity of less than 20 Pa·s at 25° C. in some embodiments. In a further embodiment, the composition has a viscosity of less than 35 Pa·s at 25° C. after storage for three months at 15° C., for example, a viscosity of less than 30 Pa·s at 25° C. after storage for three months at 15° C., especially a viscosity of less than less than 25 Pa·s at 25° C. after storage for three months at 15° C. In a further embodiment, the composition has no more than a 3.5-fold increase in the viscosity at 25° C. after storage for three months at 15° C., for example no more than a 3-fold increase in the viscosity at 25° C. after storage for three months at 15° C., especially no more than a 2.5-fold increase in the viscosity at 25° C. after storage for three months at 15° C. The liquid coverlay composition may, for example, have no more than a 2.0-fold increase in the viscosity at 25° C. after storage for three months at 15° C. in some embodiments. The liquid composition advantageously has a solids content of at least 20 wt %, for example at least 25 wt %, especially at least 30 wt %.

In one embodiment of the sixth aspect of the invention, the method comprises the further step of combining the polyamideimide having a terminal isocyanate group blocked by a thermally-dissociatable isocyanate-blocking group with one or more of a filler, a cure agent, a stabiliser or a leveling aid. In a further embodiment, the method optionally comprises the further step of combining the polyamideimide having a terminal isocyanate group blocked by a thermally-dissociatable isocyanate-blocking group with an aprotic solvent. In a yet further embodiment, the method comprises the step of adjusting the viscosity of the coverlay composition so that it has a viscosity of less than 35 Pa·s at 25° C., for example, less than 30 Pa·s at 25° C., especially less than 25 Pa·s at 25° C.

In one embodiment, the method of the seventh aspect of the invention further comprises the step of preparing the polyamideimide having a terminal isocyanate group by reacting a diisocyanate and a carboxylic acid functional group-containing carboxylic acid anhydride. Advantageously, the diisocyanate and the carboxylic acid functional group-containing carboxylic acid anhydride are reacted in a molar ratio of diisocyanate to carboxylic acid functional group-containing carboxylic acid anhydride of from approximately 10:8 to 10:12, for example from approximately 10:9 to 10:11, for example a ratio of approximately 1:1. In one embodiment, the diisocyanate and the carboxylic acid functional group-containing carboxylic acid anhydride are reacted in the presence of the isocyanate-blocking agent. Advantageously, the molar ratio of the diisocyanate to the isocyanate-blocking agent is from approximately 10:0.1 to 10:10, for example from approximately 10:1 to 10:8, such as from approximately 10:1 to 10:5. In one embodiment the molar ratio of the diisocyanate to the isocyanate-blocking agent is from approximately 10:1 to 10:3. In an alternative embodiment the molar ratio of the diisocyanate to the isocyanate-blocking agent is from approximately 10:2 to 10:6. The level of blocking agent present in the reaction mixture can be used to control the molecular weight and/or polarity of the polyamideimide polymer. A relatively high proportion of blocking agent, for example at least a 10:1 ratio of diisocyanate to blocking agent, for example at least at 10:2 results in relative short polyamideimide polymers with greater polarity and hence solubility in polar solvents. In one embodiment, the polyamideimide having a terminal isocyanate group has a number average molecular weight of at least 5000, for example at least 10000, especially at least 20000. In a further embodiment the polyamideimide having a terminal isocyanate group has a number average molecular weight of no more than 60000, for example no more than 50000.

In one embodiment of the ninth aspect of the invention, there is provided the use of a liquid polyamideimide (including unmodified, modified or photosensitive polyamideimides) to form complete or partially imaged coverlays in the production of flexible or rigid-flexible printed circuit boards. In another embodiment, there is provided the use of a liquid polyamideimide (including unmodified, modified or photosensitive polyamideimides) to form complete or partially imaged coverlays in production of displays. In another embodiment, there is provided the use of a liquid polyamideimide (including unmodified, modified or photosensitive polyamideimides) to form complete or partially imaged coverlays in production of photovoltaic devices. In another embodiment, there is provided the use of a liquid polyamideimide (including unmodified, modified or photosensitive polyamideimides) to form complete or partially imaged coverlays in production of membrane switches.

Polyamideimides can be processed as liquids in a variety of ways: (1) if of low molecular weight, they can be processed as melts or in solution; after being applied onto a surface (e.g. coated or printed) they are dried and cured (i.e. further polymerized, to a high molecular weight solid film); (2) if of high molecular weight, they are processed in solution; following application, they are simply dried. The term "liquid polyamideimides" encompasses both polyamideimide melts and polyamideimides in solution. In one embodiment the liquid polyamideimides is a polyamideimide melt.

Methods to deposit the liquid coverlay include virtually all forms of contact and non-contact printing, examples of which include but are not limited to screen printing; rotary screen printing; roller coating; dip coating; curtain coating; flood coating; spray coating (electrostatic and air); spin coating; inkjet; gravure; offset; flexo; dispensing; pad printing; brushing (including touching up damaged areas of finished film); inkjet; aerosol deposition; and any other means for depositing liquid inks or coatings. By using traditional coating methods as described above to apply liquid polyamideimide coverlays, many advantages can be realized when compared to the traditional process of applying dry films. Dry films have high costs associated due to both material consumption and man-hours required during application. Liquid polyamideimides reduce these costs by reducing material wastage (coating is only applied where needed) and eliminating the need for manual cutting/placing of dry film coverlays which is a labor intensive process. Due to the necessary manual positioning of dry film polyimide coverlays, the minimum definition which can be achieved is typically about >0.8 mm. Far greater resolution can be achieved by using liquid polyamideimides in conjunction with the aforementioned printing techniques, where the definition is governed by the chosen method of application rather than limited by the dry film coverlay. Dry film polyimide coverlays are supplied in standard thicknesses, usually 25 or 50 microns. As the liquid polyamideimides can be applied directly, application thickness can be controlled to give a processed film of the desired thickness. Other advantages offered by liquid polyamideimides include the elimination of any desmear processes following drilling/routing as the liquid polyamideimides have no need of an adhesive layer for bonding. The drilled or routed parts have smooth edges and do not suffer from other dry film issues such as dust generation.

The application of liquid coverlays is advantageous for both (a) selected areas, where holes are drilled where there is no coverlay and thus no smear can be formed, as well as (b) in full application area, in which case holes will be drilled through coverlay in the rigid part of the panel without forming smear, which otherwise would need to be removed. After application, the liquid coverlay would preferably be capable of being electroplated with no negative effects such, as loss of adhesion (which can be shown by performing thermal shock tests at elevated temperature, e.g. 288° C. for 30 seconds), thus the difficulties related to desmear can be eliminated.

In addition to offering process advantages in many electronic applications, liquid polyamideimides also have enhanced physical properties when compared to traditional dry film polyimides, such as low water absorbance (<0.1%). This allows liquid polyamideimides to be used in a wider range of electronic applications where low water absorption is a key characteristic, for example membrane switches and displays, and photovoltaic modules, where a highly weatherable dielectric coating can be applied to traditional materials such as polyvinylfluoride (PVF) backsheets.

Utilizing existing established process equipment for the application of liquid polyamideimides eliminates the requirement for any significant capital investment in order to process these materials, with the process parameters falling well within current capabilities. The liquid polyamideimides can be easily adapted to produce inks of the necessary viscosity and rheology to suit the intended application.

In one embodiment of the ninth aspect of the invention, there is provided the application of liquid polyamideimide (including modified polyamideimides) by the use of screen printing technology of any kind. In another embodiment, there is provided the application of liquid polyamideimide (including modified polyamideimides) by the use of roller coating technology. In another embodiment, there is provided the application of liquid polyamideimide (including modified polyamideimides) by the use of dip coating technology. In another embodiment, there is provided the application of liquid polyamideimide (including modified polyamideimides) by the use of curtain coating technology. In another embodiment, there is provided the application of liquid polyamideimide (including modified polyamideimides) by the use of spray coating technology (electrostatic and air). In another embodiment, there is provided the application of liquid polyamideimide (including modified polyamideimides) by the use of spin coating technology. In another embodiment, there is provided the application of liquid polyamideimide (including modified polyamideimides) by the use of ink jet technology. In another embodiment, there is provided the application of liquid polyamideimide (including modified polyamideimides) by the use of gravure coating technology. In another embodiment, there is provided the application of liquid polyamideimide (including modified polyamideimides) by the use of offset coating technology. In another embodiment, there is provided the application of liquid polyamideimide (including modified polyamideimides) by the use of flexo coating technology. In another embodiment, there is provided the application of liquid polyamideimide (including modified polyamideimides) by the use of dispensing technology. In another embodiment, there is provided the application of liquid polyamideimide (including modified polyamideimides) by the use of pad printing technology. In another embodiment, there is provided the application of liquid polyamideimide (including modified polyamideimides) by the use of brushing (including touching up damaged areas of finished film). In another embodiment, there is provided the application of liquid polyamideimide (including modified polyamideimides) by the use of flood coating technology. In another embodiment, there is provided the application of liquid polyamideimide (including modified polyamideimides) by the use of aerosol deposition technology.

The following description illustrates how the inventive use of liquid coverlays can eliminate costly work and press cycles compared to the use of dry foils.

In the case of a combination of a rigid panel with a flexible panel to give a rigid/flex circuit board, the flexible part with copper tracks and pads on the outer sides has to be protected by coverlay foil. A solid coverlay foil needs to be pressed onto the copper to give good adhesion. This is a press cycle which lasts about 2-3 hours and needs high energy as temperatures needed are typically 180-185° C. In contrast, the liquid product can be applied (for example by screen printing, et al) and dried in an oven at 150° C. without a press cycle. This applies to full area application (liquid or foil is being applied over full area of panel) as well as for selected area application.

In the case of a multilayer with foil coverlay, every single layer needs to have an individual press cycle. In the case of the use of the liquid product, only one press cycle for the whole layup (all individual materials layed up to give the multilayer) is needed at the final stage. Thus the invention helps to save time, energy and money increasingly as the design of the rigid/flex circuit board becomes more complex.

The use of liquid polyamideimides in some embodiments of the invention has been found to offers the following advantages over traditional dry film polyimide technology:

Shorter production times.

Significant cost reduction through effective material consumption—full area or partial printing possible.

Apply different thicknesses from a minimum of about 5-10 microns up to desired thickness.

Thinner construction means higher flexibility, saving space and weight.

Further cost savings realized through reduced man hours.

Energy costs also considerably reduced.

Improved FPY (First Pass Yield) through improved process stability.

FPY is the percentage of a successfully produced series of panels (e.g. if 100 panels had to be produced and 90 panels pass the Q-inspection, the FPY is 90%). Improved process stability leads to higher FPY and so to savings.

Wide process window in terms of both pre-dry (tack-dry) conditions and final cure (post-bake), which can also be incorporated into existing lamination cycles.

Better coverage of tight track configurations and high copper heights.

Reduced environmental impact (from production of foils at supplier to usage).

Easier logistics and stock keeping as lower number of materials and less space needed.

Product conforms to health & safety regulations (e.g. RoHS), no mutagenic or carcinogenic materials used.

There now follows a description of how an example of the polyamideimide having a terminal isocyanate group blocked by a thermally dissociateable isocyanate blocking group for use in the compositions of the invention may be prepared. The skilled person would appreciate that this is one of a number of routes that could be used to prepare a polyamideimide having a terminal isocyanate group blocked by a thermally dissociateable isocyanate blocking group and the example route described below should not be construed as limiting. In a first stage an imide (V) is produced in an imidisation reaction in which a carboxylic acid functional group-containing carboxylic acid anhydride (IV) is reacted with a diisocyanate (II); this is represented in Scheme 1 below.

Scheme 1

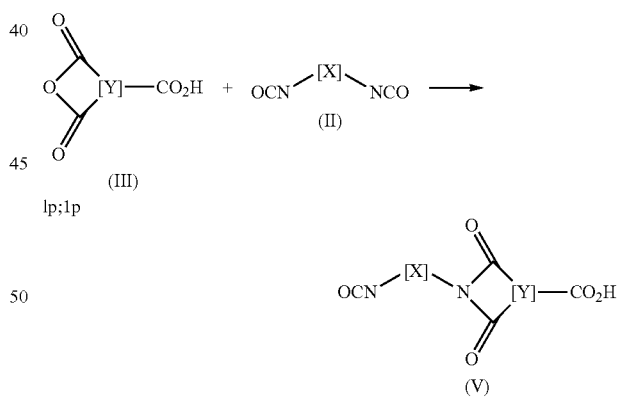

In each of Formulae (II), (IV) and (V) above, each of [X] and [Y] are as defined above. The imidisation reaction is typically conducted at a temperature of between 75-90° C. and the best results are obtained by reacting equimolar ratios of diisocyanate with a carboxylic anhydride. If an excess of carboxylic anhydride is used then the imide content is increased while with an excess of diisocyanate the imide content is reduced.

Once the imide is produced then the temperature is increased and the polymerisation reaction proceeds. In the presence of an isocyanate-blocking agent [BL]-H which has a labile proton, such as ∈-caprolactam, some reaction with isocyanate functional groups in will occur resulting in the formation of blocked isocyanate groups in the polyamideimide having a terminal isocyanate group blocked by a thermally dissociateable isocyanate blocking group of the formula (VI) as shown in Scheme 2 below. The isocyanate blocking groups prevent further reaction of the isocyanate groups which will limit the increase in viscosity of the polymer once the synthesis is complete.

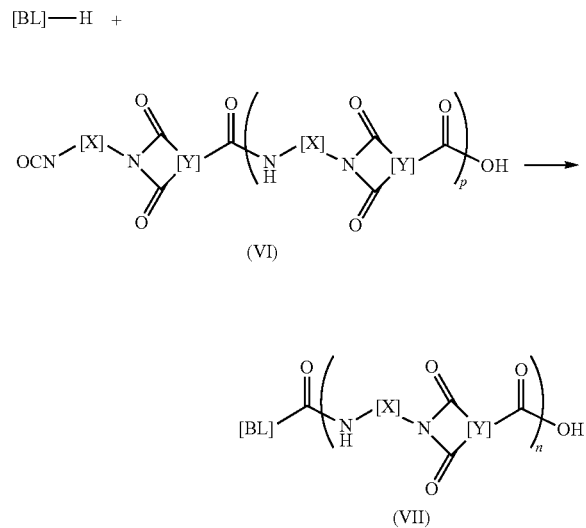

In each of Formulae (VI) and (VII) above, each of [X] and [Y] are as defined above, n at least 4 and p is n−1. Once the composition is dried on the circuit board, the isocyanate-blocking group will dissociate at elevated temperature, such as temperatures greater than 150° C. for a caproamide group to reveal the isocyanate group in a reverse of the reaction shown in scheme 2. Typically isocyanate-blocking agent is regenerated and evaporates. The isocyanate group can then polymerise with the carboxylic acid groups in the normal way in a curing reaction.

The skilled person will appreciate that the above is a simplified description of the reaction to produce the polyamideimide having a terminal isocyanate group blocked by a thermally dissociateable isocyanate blocking group for use in the composition of the invention and other mechanisms can occur. For example the isocyanate blocking agent may react with some molecules of the diisocyanate (II) prior to the imidiasation reaction and/or the isocyanate blocking agent may react with the imide (V) prior to polymerisation to form the polyimide (VI).

EXAMPLES

The invention will now be illustrated in the following specific examples. These examples should not be construed as limiting.

Ink Formulations

Inventive Resin 1

525 g of N-methylpyrrolidone was charged to a 1 liter flask fitted with a stirrer. 153 g of diphenylmethane diisocyanate with a purity of >99% was added. 122 g of trimellitic anhydride with an anhydride content of >99% and 8 g ∈-caprolactam are then added to the reactor. The reactor is then set to total reflux and slowly heated to 75° C., once at 75° C. the heat was switched off and the temperature was allowed to exotherm to 90° C. Once the evolution of carbon dioxide was complete and the imide content was >95%, the temperature was raised to 125° C. and held until the viscosity rose to between 2500-3500 mPas at 15° C. Once this viscosity has been reached, then the temperature was reduced to 90° C. and the product was discharged via a 50 micron filter.

Resin 1 had a non volatile content of 34%, acid value 84 mgKOH/g, viscosity 28000 mPas at 15° C. and showed no cracking with a 12 micron crease test on the dried polymer.

Inventive Resin 2

525 g of N-methylpyrrolidone was charges to a 1 liter flask fitted with a stirrer. 153 g of diphenylmethane diisocyanate with a purity of >99% was added to the reactor followed by 122 g of trimellitic anhydride with an anhydride content of >99% and 25 g of ∈-caprolactam. The reactor was then set to total reflux and slowly heated to 75° C., once at 75° C. the heat was switched off and the temperature was allowed to exotherm to 90° C. Once the evolution of carbon dioxide was complete the imide content was >95%, at this point the temperature was raised to 125° C. and held until the viscosity rose to between 2000-3000 mPas at 15° C. Once this viscosity had been reached, then the temperature was reduced to 90° C. and the product was discharged via a 50 micron filter.

Resin 1 had a non-volatile content of 32%, an acid value of 88 mgKOH/g, a viscosity of 24000 mPas at 15° C. and showed no cracking with a 12 micron crease test on the dried polymer.

Comparative Resin 1

525 g of N-methylpyrrolidone was charged to a 1 liter flask fitted with a stirrer. 153 g of diphenylmethane diisocyanate with a purity of >99% was added to the reactor followed by 122 g of trimellitic anhydride with an anhydride content of >99%. The reactor was then set to total reflux and slowly heated to 75° C., once at 75° C. the heat was switched off and the temperature was allowed to exotherm to 90° C. Once the evolution of carbon dioxide was complete and the imide content was be >95%, the temperature was raised to 125° C. and held until the viscosity rose to between 2500-3500 mPas at 15° C. Once this viscosity had been reached, then the temperature was reduced to 90° C. and discharged via a 50 micron filter.

Comparative Resin 1 had a non volatile content of 35%, an acid value of 85 mgKOH/g, a viscosity of 27000 mPas at 15° C. and showed no cracking with a 12 micron crease test on the dried polymer.

| Viscosity Stability at 15° C. | | | |
|---|---|---|---|
| Time Frame | Viscosity* Inventive Resin 1 | Viscosity* Inventive Resin 2 | Viscosity* Comparative Resin 1 |
| Initial | 28000 mPas | 24000 mPas | 27000 mPas |
| 1 Month | 29000 mPas | 24500 mPas | 30000 mPas |
| 2 Months | 32500 mPas | 26000 mPas | 37500 mPas |
| 3 Months | 36000 mPas | 28500 mPas | 49000 mPas |
| % increase (3 months) | 28.6% | 18.8% | 81.5% |

*Viscosities were tested using a cone and plate Anton Paar Physica MCR 101 @15° C., 25 mm cone @50 s$^{-1}$ Inventive Resins 1, 2 and Comparative Resin 1 were formulated into inks following the manufacturing method shown below:

1. Weigh out resin(s) into container
2. Mix on Dispermat with flat blade until pot is warm to touch (~3 minutes)
3. Weigh in foamblast, DICY & 2MZ-Azine
4. Mix again until smooth appearance (no powder lumps ~2 minutes)
5. Weigh in Viatalc VT10 and hand stir until wetted out
6. Mix on Dispermat (~1 minute)
7. Weigh in Aerosil R974 silica and hand stir until all powder is wetted out
8. Mix on dispermat until smooth (~3 minutes)
9. Check dispersion on grind gauge (spec≤5 μm)

The following ink formulations were evaluated:

| Inventive Inks 1-14 | | | | | | | |
|---|---|---|---|---|---|---|---|
| Material | Ink 1 | Ink 2 | Ink 3 | Ink 4 | Ink 5 | Ink 6 | Ink 7 |
| Inventive Resin 1 | 91.00 | 82.50 | 86.54 | 75.26 | 82.38 | 74.28 | 81.80 |
| Epoxy resin 1 - Epikote 828 BPADGE (100%)[1] | — | 8.50 | 4.46 | — | — | — | — |
| Epoxy resin 2 - Epiclon N673 ECN (68.76%)[2] | — | — | — | 15.74 | 8.62 | — | — |
| Epoxy resin 3 - DEN438 EPN (76.77%)[3] | — | — | — | — | — | 16.72 | 9.20 |
| Leveling aid - Foamblast UVD[4] | 1.00 | 1.00 | 1.00 | 1.00 | 1.00 | 1.00 | 1.00 |
| Cure Agent 1 - Omicure DDA5 Dicy[5] | 0.50 | 0.50 | 0.50 | 0.50 | 0.50 | 0.50 | 0.50 |
| Cure Agent 2 - Curezol 2MZ-Azine[6] | 0.50 | 0.50 | 0.50 | 0.50 | 0.50 | 0.50 | 0.50 |
| Filler 1 - Viatalc VT10 Talc[7] | 5.00 | 5.00 | 5.00 | 5.00 | 5.00 | 5.00 | 5.00 |
| Filler 2 - Aerosil R974 Silica[8] | 2.00 | 2.00 | 2.00 | 2.00 | 2.00 | 2.00 | 2.00 |
| Total | 100 | 100 | 100 | 100 | 100 | 100 | 100 |
| Material | Ink 8 | Ink 9 | Ink 10 | Ink 11 | Ink 12 | Ink 13 | Ink 14 |
| Inventive Resin 2 | 91.00 | 82.50 | 86.54 | 75.26 | 82.38 | 74.28 | 81.80 |
| Epoxy resin 1 - Epikote 828 BPADGE (100%)[1] | — | 8.50 | 4.46 | — | — | — | — |
| Epoxy resin 2 - Epiclon N673 ECN (68.76%)[2] | — | — | — | 15.74 | 8.62 | — | — |
| Epoxy resin 3 - DEN438 EPN (76.77%)[3] | — | — | — | — | — | 16.72 | 9.20 |
| Leveling aid - Foamblast UVD[4] | 1.00 | 1.00 | 1.00 | 1.00 | 1.00 | 1.00 | 1.00 |
| Cure Agent 1 - Omicure DDA5 Dicy[5] | 0.50 | 0.50 | 0.50 | 0.50 | 0.50 | 0.50 | 0.50 |
| Cure Agent 2 - Curezol 2MZ-Azine[6] | 0.50 | 0.50 | 0.50 | 0.50 | 0.50 | 0.50 | 0.50 |
| Filler 1 - Viatalc VT10 Talc[7] | 5.00 | 5.00 | 5.00 | 5.00 | 5.00 | 5.00 | 5.00 |
| Filler 2 - Aerosil R974 Silica[8] | 2.00 | 2.00 | 2.00 | 2.00 | 2.00 | 2.00 | 2.00 |
| Total | 100 | 100 | 100 | 100 | 100 | 100 | 100 |

| Comparative Inks 1-7 | | | | | | | |
|---|---|---|---|---|---|---|---|
| Material | C 1 | C 2 | C 3 | C 4 | C 5 | C 6 | C 7 |
| Comparative Resin 1 | 91.00 | 82.50 | 86.54 | 75.26 | 82.38 | 74.28 | 81.80 |
| Epoxy resin 1 - Epikote 828 BPADGE (100%)[1] | — | 8.50 | 4.46 | — | — | — | — |
| Epoxy resin 2 - Epiclon N673 ECN (68.76%)[2] | — | — | — | 15.74 | 8.62 | — | — |
| Epoxy resin 3 - DEN438 EPN (76.77%)[3] | — | — | — | — | — | 16.72 | 9.20 |
| Leveling aid - Foamblast UVD[4] | 1.00 | 1.00 | 1.00 | 1.00 | 1.00 | 1.00 | 1.00 |
| Cure Agent 1 - Omicure DDA5 Dicy[5] | 0.50 | 0.50 | 0.50 | 0.50 | 0.50 | 0.50 | 0.50 |
| Cure Agent 2 - Curezol 2MZ-Azine[6] | 0.50 | 0.50 | 0.50 | 0.50 | 0.50 | 0.50 | 0.50 |
| Filler 1 - Viatalc VT10 Talc[7] | 5.00 | 5.00 | 5.00 | 5.00 | 5.00 | 5.00 | 5.00 |
| Filler 2 - Aerosil R974 Silica[8] | 2.00 | 2.00 | 2.00 | 2.00 | 2.00 | 2.00 | 2.00 |
| Total | 100 | 100 | 100 | 100 | 100 | 100 | 100 |

[1] Euro Resins UK Ltd
[2] DIC Europe
[3] Univar Ltd
[4] Samuel Banner & Co Ltd
[5] Hubron Speciality Ltd
[6] Lansdowne Chemicals PLC
[7] Viaton Industries Ltd
[8] Evonik Degussa GmbH Application of Inks by Screen Printing:
 Mesh used: 43 T/cm polyester block
 10 mm screen snap off height
 65/70 shore squeegee used
 Panel racked vertically for 10 min. @ Room Temp before 150° C. bake Other screens can be used depending on required dry film thickness. The addition of solvent would lead to other application methods such as spray coating, curtain coating, roller coating, pad printing, gravure, flexo, offset, ink jet and spin coating.

Panel Details:
 1 oz. double-sided plain copper clad FR4 panels from Lamar Group Ltd.
 0.5 oz. single-sided copper polyimide IPCB25A design flexible laminate from Juniper Print Test Methods
Solder Resistance
Equipment Required:
 Alpha 857 flux
 Solder bath @260° C.
 Timer
Method:
 Flux each panel with Alpha 857 flux.
 Then dip the panel into the solder and start a 10 second timer.
 When the timer beeps, withdraw the panel and cool using water.
 Film should show no removal, blistering, cracking or flaking after test.

Gloss
Equipment Required:
 Panel for testing
 Sheen mini gloss 101N 60° gloss meter
 Calculator
Method:
 Measure 5 areas of each panel using the gloss meter and take an average.

X-Hatch Resistance
Equipment Required:
 Gitterschnit Cross-hatch cutter—consisting of 6 parallel blades with ~2 mm gaps
 Tape—pressure sensitive tape 3M Scotch tape brand 600 or its equivalent (e.g. branded Sellotape).
Method:
 Use the prescribed cutting tool to cross-hatch (at 90° angles) an area.
 Make all cuts 25 mm long.
 Use sufficient pressure to cut through the coating material.
 Lightly brush the cross-hatched area with a soft brush to remove any particles of coating material.
 Press a strip of pressure sensitive tape 12.5 mm wide by 50 mm long firmly across the surface of the cross hatched area using a hand roller or eraser.
 Rapidly remove the tape by manual force applied approximately perpendicular to the pattern.
 An unused strip of tape shall be used for each test, which comprises a single pull off.
 Visually examine the tape for evidence of coating material particles.
 Examine for separation, fracturing, or delamination of the coating from the surfaces of the bare material. Very fine transfer, e.g. from the cut edges, shall be ignored.
 Using the numbering system of GT0-GT5 as indicated in Table (1), assess and report the degree of adhesion.

The classification of the test results are shown in FIG. 2.

Pencil Hardness
Equipment required:
 Sheen Pencil hardness trolley 720
 Pencils graded H-9H
 Pencil sharpener
 Abrasive paper
Method:
 Using a pencil sharpener, sharpen the pencil to a fine point. Hold the point of the pencil at 90° to coarse paper and using a circular hand motion grind down the point until it gives a flat end of 1.5 mm diameter.
 Place the coated panel on a firm level, horizontal surface. Starting with the hardest grade of pencil, place the hardness trolley on a hard flat surface with the wheels in the air, place the pencil in the hole and allow hold the pencil to run through until it reaches the surface, gently tighten the screw to secure the pencil in place. Turn the trolley over and with the lead against the test panel surface on a flat level surface (trolley wheels and pencil lead). Exert sufficient uniform forward (but NOT downwards) force to move the trolley ~20 mm.
 Inspect the track for either gouges or cuts, if they are seen repeat the above with a softer pencil, record the lowest pencil the film has achieved. Pass is ≥6H Solvent Resistance
Equipment Required:
 Pot of Dichloromethane
 Timer
Method:
 Place a piece of each panel into the pot of dichloromethane and start a 1 hour timer, remove panel after this time and inspect. Film should show no signs of removal.

Flexibility/Crease Test
Equipment Required:
 ×10 eye glass
 Timer
Method:
 Fold the copper/polyimide substrate in half (ink side in) and apply pressure to the fold area using a 3 Kg weigh for ~1 minute
 Open flat and examine the crease using the ×10
 Report any cracks as a fail Print Test Results
Cure conditions in the following tables are quoted as X minutes are 150° C. followed by Y minutes at 180° C.

| Ink | Cure Conditions X, Y | Solder resistance | Gloss Pre-solder | Gloss Post-solder | X-hatch Adhesion | Pencil Hardness | Solvent Resistance | Flexibility |
|---|---|---|---|---|---|---|---|---|
| 1 | 60, 70 | Pass | 37.3 | 43.4 | Pass GT0 | Pass | Pass | Pass |
|  | 120, 70 | Pass | 47.3 | 44.4 | Pass GT0 | Pass | Pass | Pass |
|  | 180, 70 | Pass | 45.3 | 38.6 | Pass GT0 | Pass | Pass | Pass |

-continued

| Ink | Cure Conditions X, Y | Solder resistance | Gloss Pre-solder | Gloss Post-solder | X-hatch Adhesion | Pencil Hardness | Solvent Resistance | Flexibility |
|---|---|---|---|---|---|---|---|---|
| 2 | 60, 70 | Pass | 47.3 | 48.7 | Pass GT0 | Pass | Pass | Pass |
|  | 120, 70 | Pass | 47.9 | 48.1 | Pass GT0 | Pass | Pass | Pass |
|  | 180, 70 | Pass | 45.7 | 44.9 | Pass GT0 | Pass | Pass | Pass |
| 3 | 60, 70 | Pass | 44.8 | 43.6 | Pass GT0 | Pass | Pass | Pass |
|  | 120, 70 | Pass | 49.7 | 43.1 | Pass GT0 | Pass | Pass | Pass |
|  | 180, 70 | Pass | 50.0 | 45.0 | Pass GT0 | Pass | Pass | Pass |
| 4 | 60, 70 | Pass | 48.5 | 48.6 | Pass GT0 | Pass | Pass | Pass |
|  | 120, 70 | Pass | 50.8 | 51.6 | Pass GT0 | Pass | Pass | Pass |
|  | 180, 70 | Pass | 50.3 | 49.7 | Pass GT0 | Pass | Pass | Pass |
| 5 | 60, 70 | Pass | 37.6 | 37.8 | Pass GT0 | Pass | Pass | Pass |
|  | 120, 70 | Pass | 44.7 | 41.8 | Pass GT0 | Pass | Pass | Pass |
|  | 180, 70 | Pass | 43.3 | 40.2 | Pass GT0 | Pass | Pass | Pass |
| 6 | 60, 70 | Pass | 57.8 | 63.9 | Pass GT0 | Pass | Pass | Pass |
|  | 120, 70 | Pass | 59.1 | 63.9 | Pass GT0 | Pass | Pass | Pass |
|  | 180, 70 | Pass | 58.9 | 61.5 | Pass GT0 | Pass | Pass | Pass |
| 7 | 60, 70 | Pass | 55.5 | 53.7 | Pass GT0 | Pass | Pass | Pass |
|  | 120, 70 | Pass | 59.8 | 58.0 | Pass GT0 | Pass | Pass | Pass |
|  | 180, 70 | Pass | 56.6 | 56.7 | Pass GT0 | Pass | Pass | Pass |
| 8 | 60, 70 | Pass | 34.3 | 45.5 | Pass GT0 | Pass | Pass | Pass |
|  | 120, 70 | Pass | 43.4 | 45.8 | Pass GT0 | Pass | Pass | Pass |
|  | 180, 70 | Pass | 40.9 | 37.1 | Pass GT0 | Pass | Pass | Pass |
| 9 | 60, 70 | Pass | 47.3 | 48.7 | Pass GT0 | Pass | Pass | Pass |
|  | 120, 70 | Pass | 43.8 | 50.1 | Pass GT0 | Pass | Pass | Pass |
|  | 180, 70 | Pass | 42.2 | 46.5 | Pass GT0 | Pass | Pass | Pass |
| 10 | 60, 70 | Pass | 42.1 | 42.9 | Pass GT0 | Pass | Pass | Pass |
|  | 120, 70 | Pass | 54.3 | 44.7 | Pass GT0 | Pass | Pass | Pass |
|  | 180, 70 | Pass | 50.7 | 46.9 | Pass GT0 | Pass | Pass | Pass |
| 11 | 60, 70 | Pass | 48.8 | 45.8 | Pass GT0 | Pass | Pass | Pass |
|  | 120, 70 | Pass | 47.8 | 50.9 | Pass GT0 | Pass | Pass | Pass |
|  | 180, 70 | Pass | 46.4 | 47.8 | Pass GT0 | Pass | Pass | Pass |
| 12 | 60, 70 | Pass | 36.9 | 36.4 | Pass GT0 | Pass | Pass | Pass |
|  | 120, 70 | Pass | 46.1 | 43.8 | Pass GT0 | Pass | Pass | Pass |
|  | 180, 70 | Pass | 44.3 | 40.2 | Pass GT0 | Pass | Pass | Pass |
| 13 | 60, 70 | Pass | 56.8 | 65.8 | Pass GT0 | Pass | Pass | Pass |
|  | 120, 70 | Pass | 58.1 | 65.3 | Pass GT0 | Pass | Pass | Pass |
|  | 180, 70 | Pass | 58.9 | 64.5 | Pass GT0 | Pass | Pass | Pass |
| 14 | 60, 70 | Pass | 56.2 | 54.9 | Pass GT0 | Pass | Pass | Pass |
|  | 120, 70 | Pass | 58.8 | 57.8 | Pass GT0 | Pass | Pass | Pass |
|  | 180, 70 | Pass | 58.6 | 57.8 | Pass GT0 | Pass | Pass | Pass |

Comparative Inks 1-7

| Ink | Cure Conditions X, Y | Solder resistance | Gloss Pre-solder | Gloss Post-solder | X-hatch Adhesion | Pencil Hardness | Solvent Resistance | Flexibility |
|---|---|---|---|---|---|---|---|---|
| C 1 | 60, 70 | Pass | 40.1 | 43.8 | Pass GT0 | Pass | Pass | Pass |
|  | 120, 70 | Pass | 45.8 | 44.4 | Pass GT0 | Pass | Pass | Pass |
|  | 180, 70 | Pass | 44.2 | 47.8 | Pass GT0 | Pass | Pass | Pass |
| C 2 | 60, 70 | Pass | 48.9 | 50.7 | Pass GT0 | Pass | Pass | Pass |
|  | 120, 70 | Pass | 46.4 | 48.9 | Pass GT0 | Pass | Pass | Pass |
|  | 180, 70 | Pass | 48.9 | 47.5 | Pass GT0 | Pass | Pass | Pass |
| C 3 | 60, 70 | Pass | 45.1 | 47.9 | Pass GT0 | Pass | Pass | Pass |
|  | 120, 70 | Pass | 49.7 | 50.3 | Pass GT0 | Pass | Pass | Pass |
|  | 180, 70 | Pass | 50.7 | 52.6 | Pass GT0 | Pass | Pass | Pass |
| C 4 | 60, 70 | Pass | 48.8 | 51.8 | Pass GT0 | Pass | Pass | Pass |
|  | 120, 70 | Pass | 49.6 | 51.6 | Pass GT0 | Pass | Pass | Pass |
|  | 180, 70 | Pass | 50.3 | 49.7 | Pass GT0 | Pass | Pass | Pass |
| C 5 | 60, 70 | Pass | 38.9 | 40.8 | Pass GT0 | Pass | Pass | Pass |
|  | 120, 70 | Pass | 44.8 | 44.3 | Pass GT0 | Pass | Pass | Pass |
|  | 180, 70 | Pass | 46.8 | 48.7 | Pass GT0 | Pass | Pass | Pass |
| C 6 | 60, 70 | Pass | 54.7 | 63.1 | Pass GT0 | Pass | Pass | Pass |
|  | 120, 70 | Pass | 58.3 | 63.2 | Pass GT0 | Pass | Pass | Pass |
|  | 180, 70 | Pass | 60.4 | 63.5 | Pass GT0 | Pass | Pass | Pass |
| C 7 | 60, 70 | Pass | 53.6 | 54.4 | Pass GT0 | Pass | Pass | Pass |
|  | 120, 70 | Pass | 60.3 | 59.4 | Pass GT0 | Pass | Pass | Pass |
|  | 180, 70 | Pass | 59.5 | 60.1 | Pass GT0 | Pass | Pass | Pass |

All of these test results show inventive inks and comparative inks to be equal. All are pass.

A minimum cure schedule of 30 minutes at 150° C. followed by 20 minutes at 250° C. will lead to all ink systems 1-14 and comparative inks 1-7 passing a 10 second solder dip at lead-free solder temperatures of ≥288° C.

Viscosity Stability Test Results

Viscosity stability for inventive inks 1-14 plus comparative inks 1-7 over a three month period at 15° C.:

| Inventive Inks 1-7 | | | | | | | |
|---|---|---|---|---|---|---|---|
| | Viscosity | | | | | | |
| Time Frame | 1 | 2 | 3 | 4 | 5 | 6 | 7 |
| Initial, Pa · s | 7.5 | 10.5 | 8.7 | 13.5 | 11.8 | 19.8 | 13.9 |
| 1 Month, Pa · s | 7.6 | 12.8 | 8.9 | 14.8 | 12.3 | 20.2 | 14.5 |
| 2 Months, Pa · s | 8.0 | 17.8 | 9.3 | 17.1 | 14.7 | 21.4 | 16.1 |
| 3 Months, Pa · s | 8.7 | 27.8 | 9.9 | 22.5 | 17.8 | 23.7 | 19.1 |

| Inventive Inks 8-14 | | | | | | | |
|---|---|---|---|---|---|---|---|
| | Viscosity | | | | | | |
| Time Frame | 8 | 9 | 10 | 11 | 12 | 13 | 14 |
| Initial, Pa · s | 6.4 | 8.6 | 7.3 | 10.6 | 9.4 | 16.7 | 10.7 |
| 1 Month, Pa · s | 6.5 | 10.4 | 7.5 | 13.2 | 10.7 | 18.9 | 11.5 |
| 2 Months, Pa · s | 6.9 | 15.9 | 8.1 | 17.5 | 12.2 | 19.4 | 13.4 |
| 3 Months, Pa · s | 7.9 | 23.6 | 8.7 | 21.7 | 14.7 | 20.1 | 16.6 |

| Comparative Inks 1-7 | | | | | | | |
|---|---|---|---|---|---|---|---|
| | Viscosity | | | | | | |
| Time Frame | C1 | C2 | C3 | C4 | C5 | C6 | C7 |
| Initial, Pa · s | 7.3 | 10.1 | 8.3 | 13.0 | 11.1 | 19.0 | 13.1 |
| 1 Month, Pa · s | 13.2 | 31.5 | 25.3 | 46.3 | 37.5 | >100 | 49.7 |
| 2 Months, Pa · s | 29.5 | >100 | 68.5 | >100 | >100 | >100 | >100 |
| 3 Months, Pa · s | 67.3 | >100 | >100 | >100 | >100 | >100 | >100 |

Viscosities were checked using a cone and plate Haake VT550 @ 25° C., 25 mm cone at 20 s$^{-1}$ Production of Flexible Printed Circuit Boards As an example, liquid polyamideimides coverlays can be used for the production of flexible multilayer PCBs. To illustrate this process refer to the drawings section which demonstrate the differences between manufacturing these products using traditional dry-film methods (FIG. 3) versus the use of liquid polyamideimides (FIG. 4).

A particular example of an application method for manufacture of flexible multilayer PCBs in the manner described above is by flat-bed screen printing.

Example Application of Polyamideimide Ink by Flatbed Screen Printing:

Mesh used: 43 T/cm polyester block[1]
10 mm screen snap off height
65/70 shore squeegee used
Hold: Panel racked vertically for about 10 min. at room temperature.
Bake: Panel is then oven baked at elevated temperature (for example about 150° C.) for about 60 minutes to tack dry the panel[2], followed by a lamination step of about 70 minutes at elevated temperature (for example about 180° C.) to fully cure the panel.

Notes:
[1]Other screens can be used depending on required dry film thickness.
[2]Other "tack dry" conditions are possible for all application methods; times will depend on wet film weight and oven types.

Modification of the liquid coverlays (e.g. the addition of solvent and/or rheological additives) would lead to other application methods including virtually all forms of contact and non-contact printing, examples of which include but are not limited to screen printing; rotary screen printing; roller coating; dip coating; curtain coating; flood coating; spray coating (electrostatic and air); spin coating; inkjet; gravure; offset; flexo; dispensing; pad printing; brushing (including touching up damaged areas of finished film); inkjet; aerosol deposition; etc.

One preferred method of deposition is dispensing—a digital process for application of product onto selected areas whereby liquids are being applied through nozzles of the dispenser. The advantage of dispensing is to apply product onto a low number of panels as in prototyping jobs (e.g. no screen preparation has to be done, the data is digitally supplied).

The use of dispensers is well known in the PCB industry and the inventive methods of applying liquid coverlays by dispensing could be particularly advantageous in terms of cost savings when used in shorter production runs (number of panels of the same type) typically found in prototype shops, as well as with other jobs involving short production runs (e.g. below 20 panels) which are increasing in popularity.

Another advantage related to the dispensing of liquid coverlays is the transfer of production data from CAD-department (Computer Added Design) directly to the dispenser. When using foil-type coverlays, there is a need to produce artwork which is a longer, more complicated and time consuming process.

Another possible use for the application of liquid coverlays would be to fill the holes in the core and/or outer layers of a printed circuit board. This may require a modification of the viscosity and/or rheology of the liquid coverlay (by the addition of fillers, thickeners, thinners or any other traditional means for adjusting viscosity and/or rheology). For hole filling, the application of the liquid coverlay would preferably be carried out by screen printing or dispensing but could be applied by other methods as described in this application. The liquid coverlay would preferably be able to undergo grinding and electroplating processes after application and would also preferably be stable under elevated temperature (for example about 30 seconds at about 288° C.) for use in high temperature applications.

Another method for application of the liquid coverlay would be to use laser ablation or photosensitizing the liquid coverlay. This gives the possibility to use the liquid product as an alternative to foil for flex circuits, where the coverlay (foil or liquid) is used as outer protection for the copper tracks. The inventive liquid coverlay method provides an alternative to foil coverlays and can be lasered to give solderable pads with improved performance compared to photoimageable solder mask, typically used for lower flex and temperature requirements.

In addition to providing advantageous cost and time saving features, it is understood that the inventive method of applying liquid coverlays by the application methods described in this application will produce finished parts that perform according to the requirements of relevant standards for rigid/flex circuitry (e.g. IPC-A-600G) as well as the other standards and test protocol well known in the art.

Another possible use for the application of liquid coverlays includes a highly weatherable insulating layer for photovoltaic modules, which can be coated onto a variety of substrates using any of the disclosed methods. The liquid coverlay can be applied to the substrate of choice which covers the rear side of a solar module. This layer will then not only act as an insulating, highly weatherable coating, but also an adhesive to bond the module once it has been through the lamination press cycle.

Figure 4:
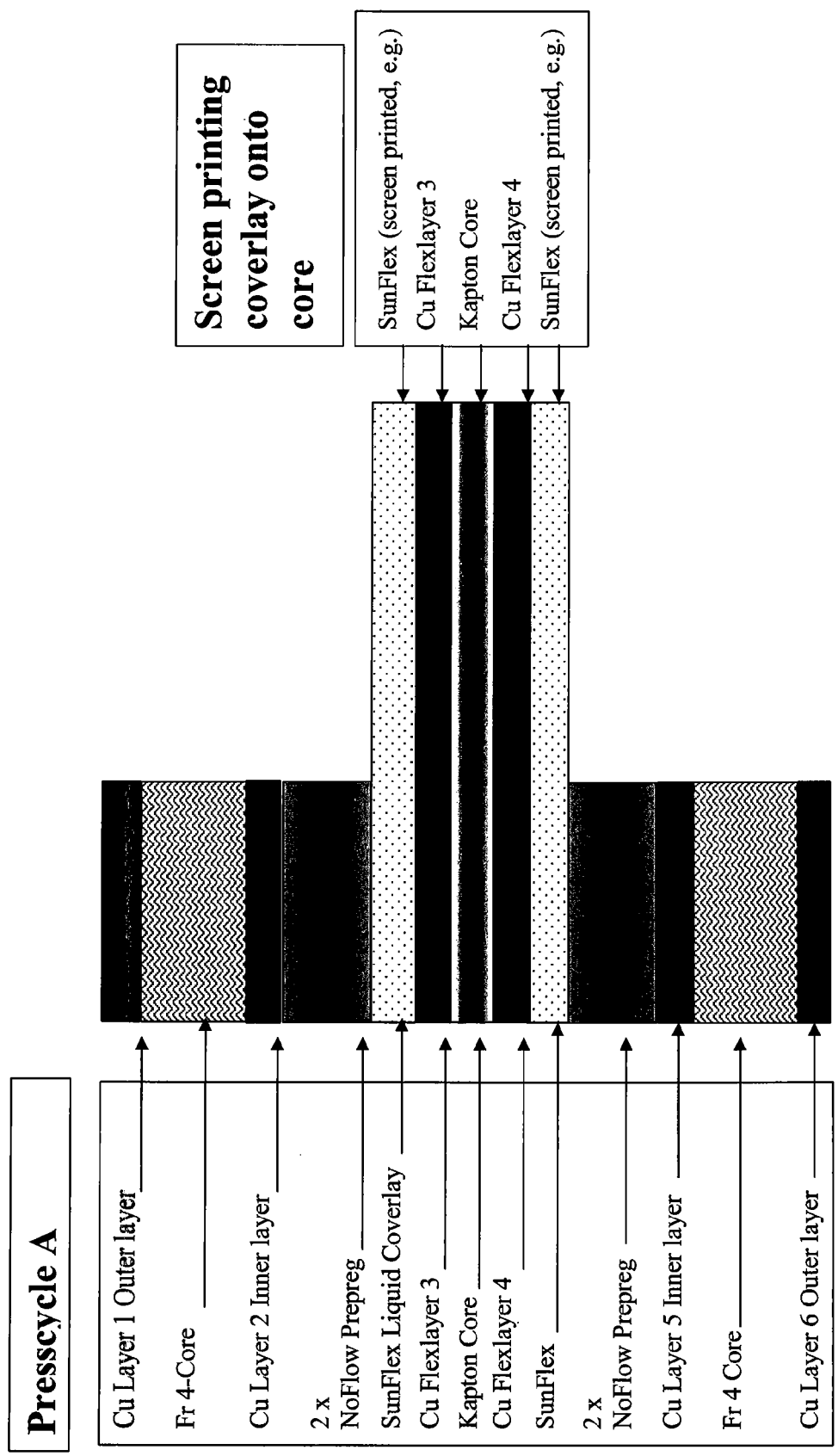
FIG. 4 shows a 6 layer rigid/flex panel using liquid screen printed coverlay.

FIGS. 3 and 4 are two diagrams showing "layups" of the individual layer materials to form a 6 layer rigid-flex circuit board.

FIG. 3 shows (on the right) a depiction of what is labeled "Press Cycle A". The materials described on the right side of the block describe which kind of layer is being used. In this example a Kapton® core (Kapton® is the name of the material as sold on the market by DuPont, this is polyimide with copper foils—described as Cu-Flexlayer 3 and 4) of various thickness is present on both sides. The core is then covered on both sides using coverlay foil with acrylic or epoxy adhesive. This is the first "lay up" and forms the flexible part of the rigid-flex circuit board. It is headed Press cycle A as this package has to be pressed using about 185° C. in a cycle that lasts 2-3 hours. To produce the left part of the PCB of FIG. 3 layup is continued on the pressed part A using the described materials such as No Flow Prepreg, copper layer, FR4 core, copper layer on both sides. Using these materials, the rigid part of the rigid-flex circuitry is formed as the materials used are less flexible. A second press cycle, Press cycle B, is needed to complete the circuit board.

FIG. 4 illustrates how the same circuit board can be produced but with the inventive method of applying a liquid coverlay (e.g. SunFlex from Sun Chemical). On the right block, liquid coverlay replaces the coverlay foil and avoids the adhesive which is the reason for many difficulties as described in this application. This flexible part does not need a press cycle so this processing step can be eliminated. After an oven drying step of the printed liquid coverlay, the layup is ready to be handled and to be used to form the rigid part as with FIG. 3. Only one final press cycle is needed.

The present invention has been described in detail, including the preferred embodiments thereof. However, it will be appreciated that those skilled in the art, upon consideration of the present disclosure, may make modifications and/or improvements on this invention that fall within the scope and spirit of the invention.

The invention claimed is:

1. A thermal-curing coverlay composition for a flexible printed circuit board substrate, comprising a polyamideimide having a terminal isocyanate group blocked by a thermally-dissociatable isocyanate-blocking group, and an aprotic solvent; wherein the molar ratio of diisocyanate to isocyanate-blocking agent is from 10:0.1 to 10:2.

2. The composition of claim 1, wherein the polyamideimide having a terminal isocyanate group blocked by a thermally-dissociatable isocyanate-blocking group is the reaction product of (i) a polyamideimide having a terminal isocyanate group and (ii) an aliphatic amide.

3. The composition of claim 2, wherein the aliphatic amide is a 5 to 8-membered lactam optionally substituted with one or more $C_1$-$C_4$ alkyl groups.

4. The composition of claim 3, wherein the 5 to 8-membered lactam is ∈-caprolactam.

5. The composition of claim 1, wherein the polyamideimide having a terminal isocyanate group blocked by a thermally-dissociatable isocyanate-blocking group has the formula (I):

$$[BL]\text{-}C(O)\text{-}([A]\text{-}[B])_n\text{—OH} \qquad (I)$$

wherein: $([A]\text{-}[B])_n$ is a polyamideimide unit in which n is at least 4; and [BL] is a thermally-dissociatable isocyanate-blocking group.

6. The composition of claim 5, wherein [BL] is —N($R^1$)—C(O)$R^2$, wherein either $R^1$ and $R^2$ are each independently selected from $C_1$-$C_6$ alkyl; or $R^1$, $R^2$ and the amide group to which they are attached together form a 5 to 8-membered lactam ring, optionally substituted with one or more $C_1$-$C_4$ alkyl groups.

7. The composition of claim 6, wherein $R^1$, $R^2$ and the nitrogen atom and carbonyl group to which they are attached together forms a 5 to 8-membered lactam ring, optionally substituted with one or more methyl groups.

8. The composition of claim 1, wherein the thermally-dissociatable isocyanate-blocking group dissociates at a temperature in the range of from 100° C. to 250° C.

9. The composition of claim 8, wherein the thermally-dissociatable isocyanate-blocking group dissociates at a temperature in the range of from 140° C. to 200° C.

10. The composition of claim 1, wherein the polyamideimide having a terminal isocyanate group is the reaction product of a diisocyanate and a carboxylic acid functional group-containing carboxylic acid anhydride.

11. The composition of claim 1 having a viscosity of less than 30 Pas at 25° C.

12. The composition of claim 11 having a viscosity of less than 20 Pas at 25° C.

* * * * *